US012724350B2

(12) United States Patent
Nakaie et al.

(10) Patent No.: US 12,724,350 B2
(45) Date of Patent: Sep. 1, 2026

(54) PATTERN-FORMING COMPOSITION

(71) Applicant: Nissan Chemical Corporation, Tokyo (JP)

(72) Inventors: Naoki Nakaie, Funabashi (JP); Kenji Takase, Funabashi (JP); Yudai Sugawara, Toyama (JP)

(73) Assignee: NISSAN CHEMICAL CORPORATION, Tokyo (JP)

(*) Notice: Subject to any disclaimer, the term of this patent is extended or adjusted under 35 U.S.C. 154(b) by 872 days.

(21) Appl. No.: 17/783,294

(22) PCT Filed: Dec. 7, 2020

(86) PCT No.: PCT/JP2020/045547
§ 371 (c)(1),
(2) Date: Jun. 8, 2022

(87) PCT Pub. No.: WO2021/117692
PCT Pub. Date: Jun. 17, 2021

(65) Prior Publication Data

US 2023/0045061 A1 Feb. 9, 2023

(30) Foreign Application Priority Data

Dec. 9, 2019 (JP) ................................ 2019-222293
Mar. 30, 2020 (JP) ................................ 2020-060290
Apr. 9, 2020 (JP) ................................ 2020-070203

(51) Int. Cl.
*G03F 7/40* (2006.01)
*C08G 73/06* (2006.01)
(Continued)

(52) U.S. Cl.
CPC .......... *G03F 7/40* (2013.01); *C08G 73/0644* (2013.01); *G02B 1/041* (2013.01); *G03F 7/032* (2013.01); *H10K 50/00* (2023.02)

(58) Field of Classification Search
CPC ................................................ C08G 73/0644
See application file for complete search history.

(56) References Cited

U.S. PATENT DOCUMENTS 8,618,243 B2 * 12/2013 Nishimura ............ C08G 73/00 510/276
10,106,701 B2 * 10/2018 Kaseyama .............. C09D 7/48
(Continued)

FOREIGN PATENT DOCUMENTS

CN 114599704 A 6/2022
EP 4 050 049 A1 8/2022
(Continued)

OTHER PUBLICATIONS

Machine translation of JP 2004-156001 (no date) (Year: 0000).*
(Continued)

*Primary Examiner* — Amanda C. Walke
(74) *Attorney, Agent, or Firm* — Birch, Stewart, Kolasch & Birch, LLP

(57) ABSTRACT

Provided is, for example, a pattern-forming composition that contains a triazine ring-containing polymer having a predetermined repeating unit structure, represented by formula [4] below, a crosslinking agent, and an organic solvent.

(Continued)

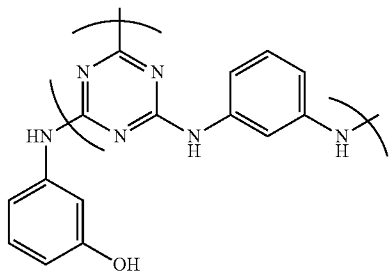

[4]

3 Claims, 3 Drawing Sheets

(51) Int. Cl.

| | |
|---|---|
| ***G02B 1/04*** | (2006.01) |
| ***G03F 7/032*** | (2006.01) |
| ***H10K 50/00*** | (2023.01) |

(56) References Cited

U.S. PATENT DOCUMENTS

| | | | | |
|---|---|---|---|---|
| 10,928,729 | B2 * | 2/2021 | Nishimura | C08L 79/02 |
| 2012/0049308 | A1 | 3/2012 | Nishimura et al. | |
| 2014/0008751 | A1 | 1/2014 | Nishimura et al. | |
| 2014/0371367 | A1 | 12/2014 | Nishimura et al. | |
| 2015/0252147 | A1 | 9/2015 | Maeda et al. | |
| 2017/0362382 | A1 | 12/2017 | Nishimura et al. | |
| 2018/0142064 | A1 | 5/2018 | Nishimura et al. | |
| 2018/0215870 | A1 | 8/2018 | Nishimura et al. | |
| 2019/0169371 | A1 | 6/2019 | Nishimura | |
| 2019/0367674 | A1 * | 12/2019 | Ishii | C08L 101/00 |
| 2021/0179779 | A1 * | 6/2021 | Kaseyama | C08K 5/3492 |
| 2023/0002555 | A1 | 1/2023 | Nakaie | |

FOREIGN PATENT DOCUMENTS

| | | | | | |
|---|---|---|---|---|---|
| JP | 2004-156001 | A | | 6/2004 | |
| JP | 2004292975 | A | * | 10/2004 | |
| JP | 3817696 | B2 | | 9/2006 | |
| JP | 2006330655 | A | * | 12/2006 | |
| JP | 2013245206 | A | * | 12/2013 | |
| JP | 2018036566 | A | * | 3/2018 | G03F 7/70275 |
| JP | 6468198 | B2 | | 2/2019 | |
| TW | 201930399 | A | | 8/2019 | |
| WO | WO 2010/128661 | A1 | | 11/2010 | |
| WO | WO 2013/094663 | A1 | | 6/2013 | |
| WO | WO 2015/098787 | A1 | | 7/2015 | |
| WO | WO-2015098788 | A1 | * | 7/2015 | C09D 163/00 |
| WO | WO 2016/024613 | A1 | | 2/2016 | |
| WO | WO 2016/114337 | A1 | | 7/2016 | |
| WO | WO-2016117524 | A1 | * | 7/2016 | C08G 73/06 |
| WO | WO 2016/194926 | A1 | | 12/2016 | |
| WO | WO 2017/138547 | A1 | | 8/2017 | |
| WO | WO 2019/09320 | A1 | | 5/2019 | |

OTHER PUBLICATIONS

Machine translation of WO 2015/098788 (no date) (Year: 0000).*
Machine translation of WO 2016/117524 (no date) (Year: 0000).*
Machine translation of JP 2018-036566 (no date) (Year: 0000).*
Taiwanese Office Action and Search Report for Taiwanese Application No. 109143190, dated Apr. 12, 2024, with English translation.
International Search Report, issued in PCT/JP2020/045547, dated Feb. 16, 2021.
Written Opinion of the International Searching Authority, issued in PCT/JP2020/045547, dated Feb. 16, 2021.
Chinese Office Action for Chinese Application No. 202080085418.0, dated Sep. 26, 2024, with an English translation.
Japanese Office Action for Japanese Application No. 2021-563956, dated Aug. 6, 2024, with English translation.
Extended European Search Report for European Application No. 20899441.8, dated Nov. 15, 2023.
Office Action issued Feb. 19, 2025, in Chinese Patent Application No. 202080085418.0.
Taiwanese Office Action for Taiwanese Application No. 109143190, dated Oct. 30, 2024, with an English translation.
Korean Office Action for Korean Application No. 10-2022-7023163, dated Apr. 21, 2025, with English translation.
Chinese Office Action for Chinese Application No. 202080085418.0, dated Mar. 31, 2026, with an English translation.

* cited by examiner

PATTERN-FORMING COMPOSITION

TECHNICAL FIELD

The present invention relates to a pattern-forming composition.

BACKGROUND ART

There have recently been increasing demands for polymer materials with advanced functions, in development of electronic devices including liquid crystal display, organic electroluminescence (EL) display, touch panel, optical semiconductor (LED) element, solid-state image sensor, organic thin-film solar cell, dye-sensitized solar cell, and organic thin-film transistor (TFT).

Specific properties required therefor include 1) heat resistance, 2) transparency, 3) high refractive index, 4) high solubility, 5) low volume shrinkage, 6) hot-humid resistance, and 7) high film hardness.

In this regard, the present applicant has already found that a polymer that contains a repeating unit having a triazine ring and an aromatic ring demonstrates a high refractive index; that such polymer can achieve, solely by itself, high heat resistance, high transparency, high refractive index, high solubility, and low volume shrinkage; and that the polymer is therefore suitable for a film-forming composition when manufacturing the electronic devices (Patent Literature 1).

Meanwhile, the organic electroluminescence display usually suffers from a problem of low light extraction efficiency, meaning that emitted light can come out of the device only with low efficiency.

Among various techniques for light extraction having been developed to solve this issue, one known technique uses a high refractive index layer or a high refractive index pattern, aiming at eliminating difference in refractive index between layers, which is one of causes of loss of light before coming outside.

Many negative photosensitive compositions for forming the high refractive index pattern have been proposed, and also the present applicant has reported various materials capable of forming a negative high refractive index pattern (see Patent Literatures 2 to 4).

The negative material, however, usually tends to produce a reversely tapered pattern or an undercut after development, since the pattern is formed by a residual part having been cured by light emitted from the top, and this particularly makes it difficult to produce a pattern with a so-called convex lens shape.

CITATION LIST

Patent Literature

Patent Literature 1: WO 2010/128661
Patent Literature 2: WO 2016/024613
Patent Literature 3: WO 2016/114337
Patent Literature 4: WO 2019/093203

SUMMARY OF INVENTION

Technical Problem

There has therefore been a demand for a composition capable of forming a negative high refractive index pattern.

The present invention has been made considering the circumstances, aiming at providing a pattern-forming composition capable of forming a pattern with high refractive index and high transparency.

Solution to Problem

The present inventors found, from our thorough investigations to reach the aim, that a fine pattern with high refractive index and transparency may be formed by using a composition that contains a triazine ring-containing polymer in which at least a part of triazine ring terminal is blocked with a hydroxy group-substituted arylamino group, and a crosslinking agent, and the finding led us to complete the present invention.

That is, the present invention provides the following items:

[1] A pattern-forming composition comprising a triazine ring-containing polymer that contains a repeating unit structure represented by formula (1) below and at least one triazine ring terminal, at least a part of the triazine ring terminal being blocked with a hydroxy group-substituted arylamino group; a crosslinking agent; and an organic solvent, (1)

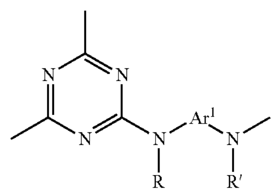

wherein each of R and R' independently represents a hydrogen atom, an alkyl group, an alkoxy group, an aryl group, or an aralkyl group, and $Ar^1$ represents at least one structure selected from the group consisting of structures represented by formulae (2) to (13)

(2)

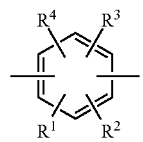

(3)

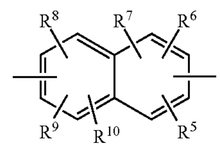

(4)

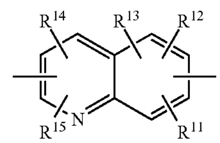

(5)

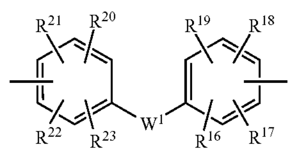

-continued (6)

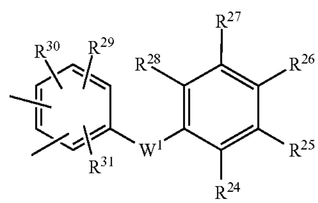

(7)

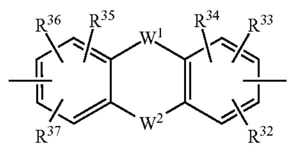

(8)

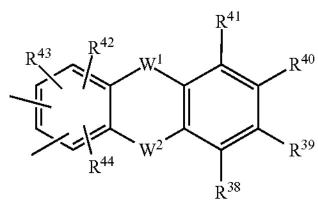

(9)

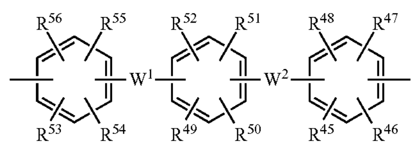

(10)

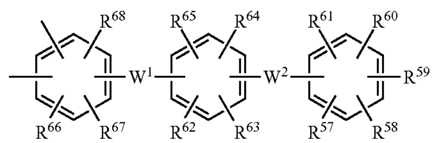

(11)

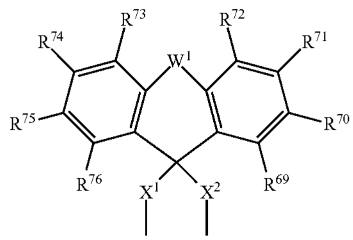

(12)

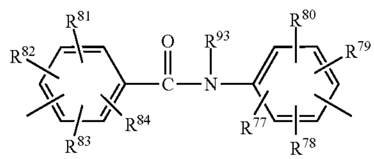

(13)

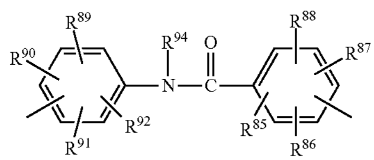

wherein each of $R^1$ to $R^{92}$ independently represents a hydrogen atom, a halogen atom, a sulfo group, an alkyl group having 1 to 10 carbon atoms, or an alkoxy group having 1 to 10 carbon atoms, each of $R^{93}$ and $R^{94}$ represents a hydrogen atom or an alkyl group having 1 to 10 carbon atoms, each of $W^1$ and $W^2$ independently represents a single bond, $CR^{95}R^{96}$ (each of $R^{95}$ and $R^{96}$ independently represents a hydrogen atom or an alkyl group having 1 to 10 carbon atoms (where, they may form a ring together)), C═O, O, S, SO, $SO_2$, or $NR^{97}$ ($R^{97}$ represents a hydrogen atom, an alkyl group having 1 to 10 carbon atoms, or a phenyl group), each of $X^1$ and $X^2$ independently represents a single bond, an alkylene group having 1 to 10 carbon atoms, or a group represented by formula (14)

(14)

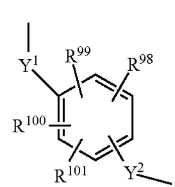

wherein each of $R^{98}$ to $R^{101}$ independently represents a hydrogen atom, a halogen atom, a sulfo group, an alkyl group having 1 to 10 carbon atoms, or an alkoxy group having 1 to 10 carbon atoms, and each of $Y^1$ and $Y^2$ independently represents a single bond or an alkylene group having 1 to 10 carbon atoms.

[2] The pattern-forming composition according to [1], wherein the hydroxy group-substituted arylamino group is represented by formula (15) below:

(15)

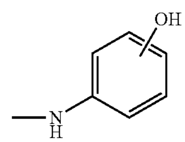

[3] The pattern-forming composition according to [2], wherein the hydroxy group-substituted arylamino group is represented by formula (16) below:

(16)

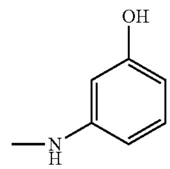

[4] The pattern-forming composition according to any one of [1] to [3], wherein $Ar^1$ is represented by formula (17) below:

(17)

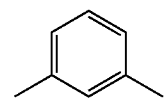

[5] The pattern-forming composition according to any one of [1] to [4], wherein the crosslinking agent is a polyfunctional (meth)acrylic compound.

[6] The pattern-forming composition according to any one of [1] to [5], intended for use in a light extraction layer of an organic electroluminescence element.

[7] A cured article produced from the pattern-forming composition according to any one of [1] to [5].

[8] The cured article according to [7], being a lens.

[9] An electronic device including a base, and the cured article according to [7] or [8] formed on the base.

[10] The electronic device according to [9], being an organic electroluminescence device.

[11] An optical component including a base, and the cured article according to [7] or [8] formed on the base.

[12] A method for producing a pattern, the method including: applying the pattern-forming composition according to any one of [1] to [5] to a base; evaporating off the organic solvent; irradiating the composition with light through a mask having a pattern formed thereon; developing the composition; and further baking the composition.

[13] A triazine ring-containing polymer that contains a repeating unit structure represented by formula (1) below and at least one triazine ring terminal, at least a part of the triazine ring terminal being blocked with a hydroxy group-substituted arylamino group, (1)

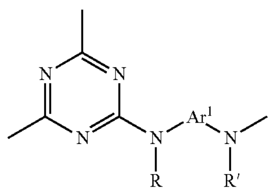

wherein each of R and R' independently represents a hydrogen atom, an alkyl group, an alkoxy group, an aryl group, or an aralkyl group, and $Ar^1$ represents at least one structure selected from the group consisting of structures represented by formulae (2) to (13)

(2)

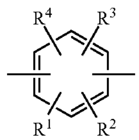

(3)

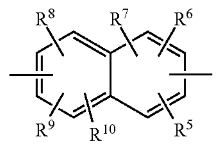

(4)

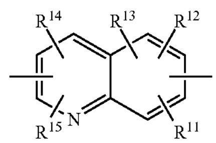

(5)

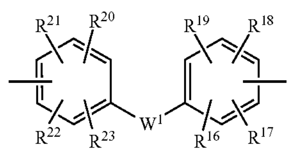

-continued (6)

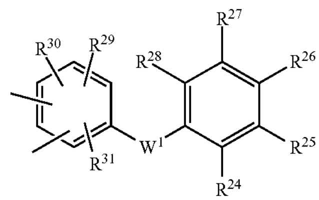

(7)

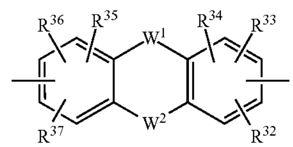

(8)

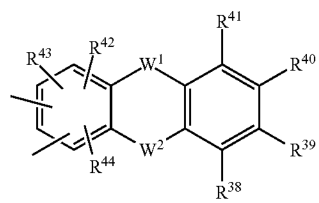

(9)

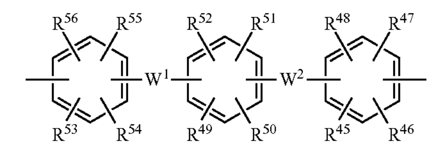

(10)

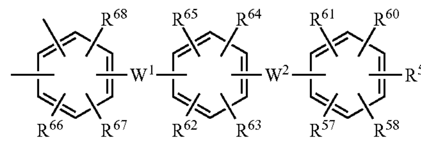

(11)

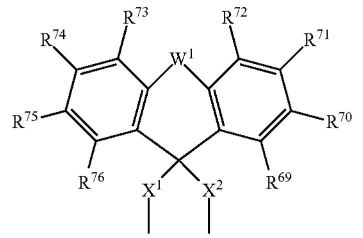

(12)

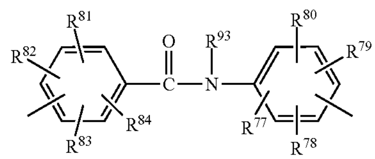

(13)

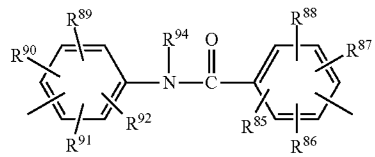

wherein each of $R^1$ to $R^{92}$ independently represents a hydrogen atom, a halogen atom, a sulfo group, an alkyl group having 1 to 10 carbon atoms, or an alkoxy group having 1 to 10 carbon atoms, each of $R^{93}$ and $R^{94}$ represents a hydrogen atom or an alkyl group having 1 to 10 carbon atoms, each of $W^1$ and $W^2$ independently represents a single bond, $CR^{95}R^{96}$ (each of $R^{95}$ and $R^{96}$ independently represents a hydrogen atom or an alkyl group having 1 to 10 carbon atoms (where, they may form a ring together)), C═O, O, S, SO, $SO_2$, or $NR^{97}$ ($R^{97}$ represents a hydrogen atom, an alkyl group having 1 to 10 carbon atoms, or a phenyl group), each of $X^1$ and $X^2$ independently represents a single bond, an alkylene group having 1 to 10 carbon atoms, or a group represented by formula (14)

(14)

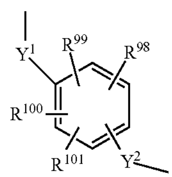

wherein each of $R^{98}$ to $R^{101}$ independently represents a hydrogen atom, a halogen atom, a sulfo group, an alkyl group having 1 to 10 carbon atoms, or an alkoxy group having 1 to 10 carbon atoms, and each of $Y^1$ and $Y^2$ independently represents a single bond or an alkylene group having 1 to 10 carbon atoms.

[14] A triazine ring-containing polymer according to [13], wherein the hydroxy group-substituted arylamino group is represented by formula (15) below:

(15)

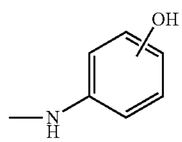

[15] A triazine ring-containing polymer according to [14], wherein the hydroxy group-substituted arylamino group is represented by formula (16) below:

(16)

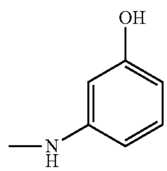

[16] The triazine ring-containing polymer according to any one of [13] to [15], wherein $Ar^1$ is represented by formula (17) below:

(17)

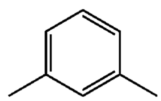

Advantageous Effects of Invention

The composition of the present invention can give a fine pattern with high refractive index and high transparency, after pattern-wise exposure typically through a mask, followed by curing, alkali development, and baking.

The pattern formed from the composition of the present invention can demonstrate properties including high heat resistance, high refractive index, and low volume shrinkage which are ascribed to the triazine ring-containing polymer, and is suitably applicable to the fields of electronic devices and optical materials, when manufacturing a component of liquid crystal display, organic electroluminescence (EL) display, touch panel, optical semiconductor (LED) element, solid-state image sensor, organic thin-film solar cell, dye-sensitized solar cell, organic thin-film transistor (TFT), lens, prism, camera, binoculars, microscope, semiconductor exposure apparatus, and so forth.

In particular, the pattern formed from the composition of the present invention may be suitably used as a patterned article for light extraction in organic EL display.

DESCRIPTION OF EMBODIMENTS

Figure 1:
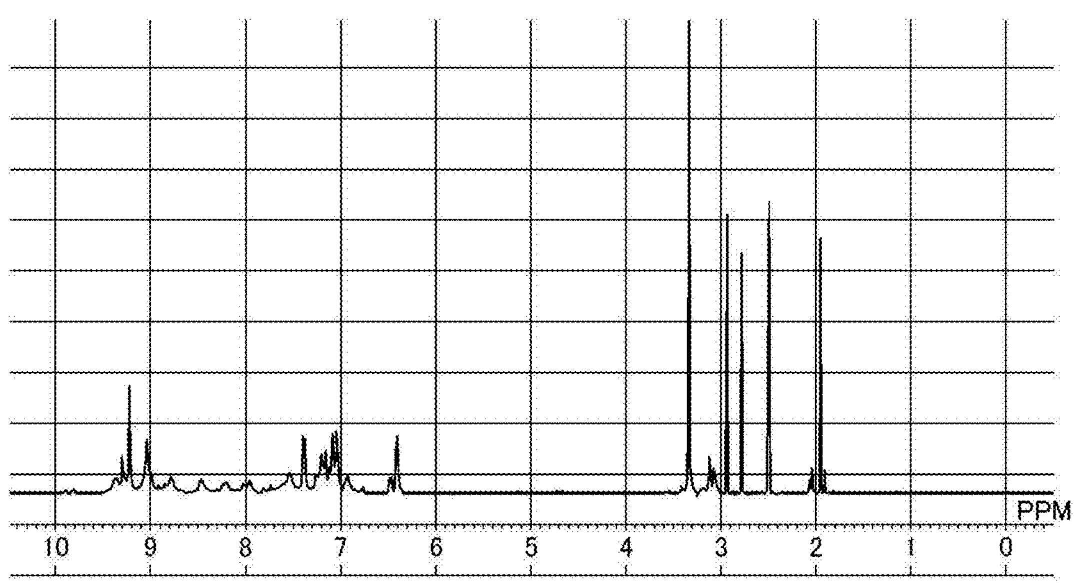
FIG. 1 is a $^1$H-NMR spectral chart of a polymer compound [4] obtained in Example 1.

The present invention will further be detailed.

The pattern-forming composition of the present invention includes a triazine ring-containing polymer that contains a repeating unit structure represented by formula (1) below, having at least one triazine ring terminal, and at least a part of the triazine ring terminal is blocked with a hydroxy group-substituted arylamino group; a crosslinking agent; and an organic solvent.

(1) Triazine Ring-Containing Polymer

The triazine ring-containing polymer of the present invention contains a repeating unit structure represented by formula (1) below.

The triazine ring-containing polymer is typically a so-called hyperbranched polymer. The hyperbranched polymer is a highly branched polymer having an irregular branched structure. The term "irregular" as used herein means that it is more irregular than the branched structure of a dendrimer which is a highly branched polymer having a regular branched structure.

For example, the triazine ring-containing polymer, which is a hyperbranched polymer, includes a structure (structure A) formed by bound each of three sites of bonding of the repeating unit structure represented by formula (1) to the repeating unit structure represented by formula (1), and here the structure A is a structure larger than the repeating unit structure represented by formula (1). In the triazine ring-containing polymer, being a hyperbranched polymer, the structure A is distributed throughout, but excluding the terminal of, the triazine ring-containing polymer.

In the triazine ring-containing polymer, being a hyperbranched polymer, the repeating unit structure may be substantially composed only of the repeating unit structure represented by formula (1).

(1)

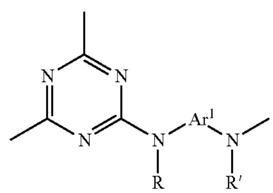

In the formula, each of R and R' independently represents a hydrogen atom, an alkyl group, an alkoxy group, an aryl group, or an aralkyl group, wherein both of them preferably represent a hydrogen atom from the viewpoint of further increasing the refractive index.

In the present invention, the number of carbon atoms of the alkyl group is preferably, but not specifically limited to, 1 to 20. In consideration of further enhancing the heat resistance of the polymer, the number of carbon atoms of the alkyl group is more preferably 1 to 10, and even more preferably 1 to 3. The structure of the alkyl group is not particularly limited, and may typically be chain-like, branched, cyclic, or combinations of two or more of them.

The alkyl group is specifically exemplified by methyl, ethyl, n-propyl, isopropyl, cyclopropyl, n-butyl, isobutyl, s-butyl, t-butyl, cyclobutyl, 1-methyl-cyclopropyl, 2-methyl-cyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-isopropyl-cyclopropyl, 2-isopropyl-cyclopropyl, 1,2,2-trimethyl-cyclopropyl, 1,2,3-trimethyl-cyclopropyl, 2,2,3-trimethyl-cyclopropyl, 1-ethyl-2 methyl-cyclopropyl, 2-ethyl-1-methyl-cyclopropyl, 2-ethyl-2-methyl-cyclopropyl, and 2-ethyl-3-methyl-cyclopropyl groups.

The number of carbon atoms of the alkoxy group is preferably, but not specifically limited to, 1 to 20. In consideration of further enhancing the heat resistance of the polymer, the number of carbon atoms of the alkoxy group is more preferably 1 to 10, and even more preferably 1 to 3. The structure of the alkyl moiety is not particularly limited, and may typically be chain-like, branched, cyclic, or combinations of two or more of them.

The alkoxy group is specifically exemplified by methoxy, ethoxy, n-propoxy, isopropoxy, n-butoxy, isobutoxy, s-butoxy, t-butoxy, n-pentoxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy, and 1-ethyl-2-methyl-n-propoxy groups.

The number of carbon atoms of the aryl group is preferably, but not specifically limited to, 6 to 40. In consideration of further enhancing the heat resistance of the polymer, the number of carbon atoms is more preferably 6 to 16, and even more preferably 6 to 13.

In the present invention, the aryl group includes aryl group having a substituent. The substituent is exemplified by halogen atom, alkyl group having 1 to 6 carbon atoms, alkoxy group having 1 to 6 carbon atoms, nitro group, and cyano group.

The aryl group is specifically exemplified by phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl, and 9-phenanthryl groups.

The number of carbon atoms of the aralkyl group is preferably, but not specifically limited to, 7 to 20. The structure of the alkyl moiety is not particularly limited, and may typically be straight chain-like, branched, cyclic, or combinations of two or more thereof.

In the present invention, the aralkyl group includes aralkyl group having a substituent. The substituent is exemplified by halogen atom, alkyl group having 1 to 6 carbon atoms, alkoxy group having 1 to 6 carbon atoms, nitro group, and cyano group.

Specific examples thereof include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl, and an α-naphthylmethyl groups.

$Ar^1$ represents at least one group selected from those represented by formulae (2) to (13).

(2)

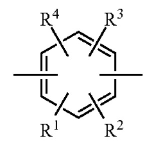

(3)

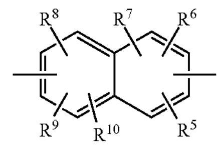

(4)

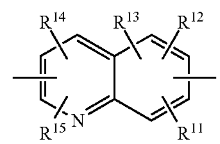

-continued (5)

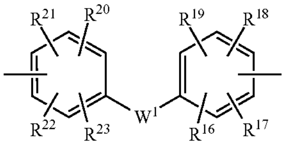

(6)

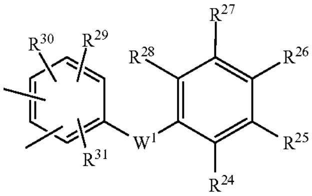

(7)

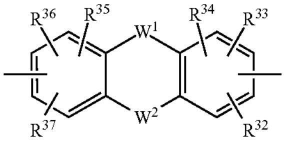

(8)

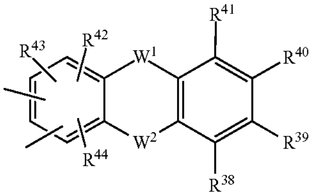

(9)

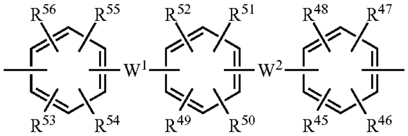

(10)

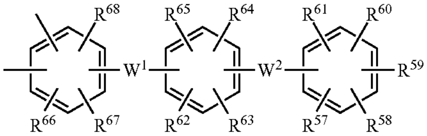

(11)

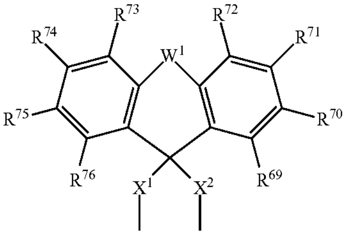

(12)

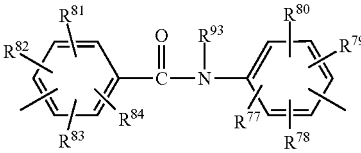

(13)

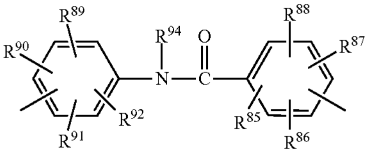

Each of $R^1$ to $R^{92}$ independently represents a hydrogen atom, a halogen atom, a sulfo group, an alkyl group having 1 to 10 carbon atoms, or an alkoxy group having 1 to 10 carbon atoms, each of $R^{93}$ and $R^{94}$ represents a hydrogen atom or an alkyl group having 1 to 10 carbon atoms, and each of $W^1$ and $W^2$ independently represents a single bond, $CR^{95}R^{96}$ (each of $R^{95}$ and $R^{96}$ independently represents a hydrogen atom or an alkyl group having 1 to 10 carbon atoms (where, they may form a ring together)), C═O, O, S, SO, $SO_2$, or $NR^{97}$ ($R^{97}$ represents a hydrogen atom, an alkyl group having 1 to 10 carbon atoms, or a phenyl group).

The halogen atom is exemplified by fluorine atom, chlorine atom, bromine atom, and iodine atom.

The alkyl group and the alkoxy group are exemplified by those same as the aforementioned ones.

Each of $X^1$ and $X^2$ independently represents a single bond, an alkylene group having 1 to 10 carbon atoms, or a group represented by formula (14).

The structures of these alkyl group, alkoxy group and alkylene group are not specifically limited, and may typically be chain-like, branched, cyclic, or any combination of two or more of them.

(14)

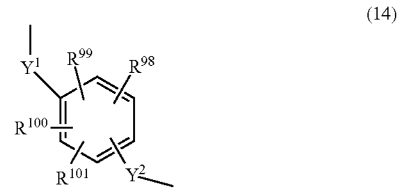

Each of $R^{98}$ to $R^{101}$ independently represents a hydrogen atom, a halogen atom, a sulfo group, an alkyl group having 1 to 10 carbon atoms, or an alkoxy group having 1 to 10 carbon atoms, and each of $Y^1$ and $Y^2$ independently represents a single bond or an alkylene group having 1 to 10 carbon atoms.

These halogen atom, alkyl group, and alkoxy group are exemplified by those similar to the halogen atom, alkyl group, and alkoxy group represented by $R^1$ to $R^{92}$.

The structures of the alkyl group and the alkoxy group represented by $R^{98}$ to $R^{101}$ are not specifically limited, and may typically be chain-like, branched, cyclic, or combinations of two or more of them.

The structures of the alkylene group represented by $Y^1$ and $Y^2$ are not specifically limited, and may typically be chain-like, branched, cyclic, or any combination of two or more of them.

The alkylene group having 1 to 10 carbon atoms is exemplified by methylene, ethylene, propylene, trimethylene, tetramethylene, and pentamethylene groups.

The structure of the alkyl group is not particularly limited, and may typically be chain-like, branched, cyclic, or combinations of two or more of them.

In particular, $Ar^1$ preferably represents at least one group represented by formulae (2), and (5) to (13), and more preferably represents at least one group represented by formulae (2), (5), (7), (8), and (11) to (13). The aryl group represented by formulae (2) to (13) are specifically exemplified by, but not limited to, those represented by the formulae below.

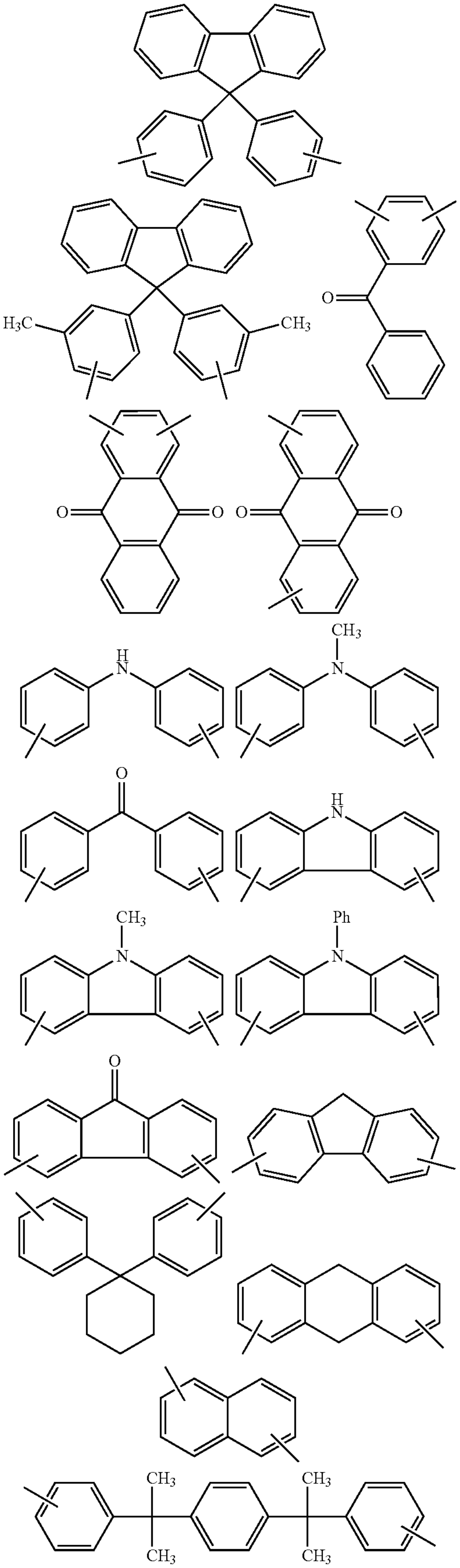
-continued
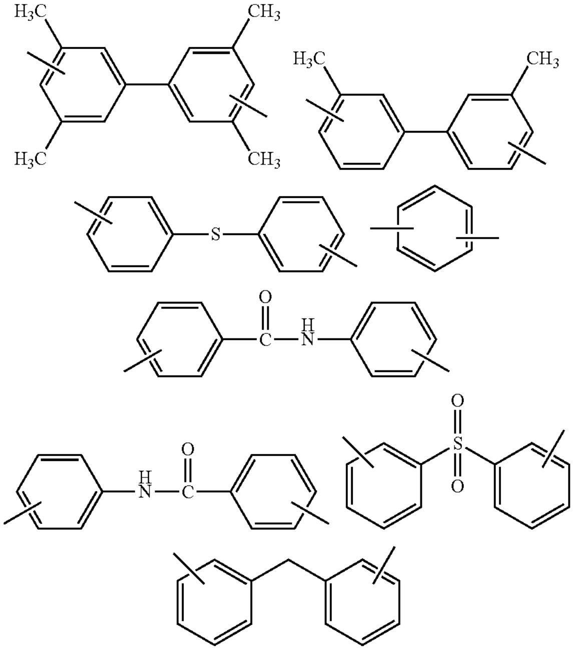
"Ph" represents a phenyl group.
Among them, more preferred is an aryl group represented by formula below, from the viewpoint of obtaining the polymer with higher refractive index.
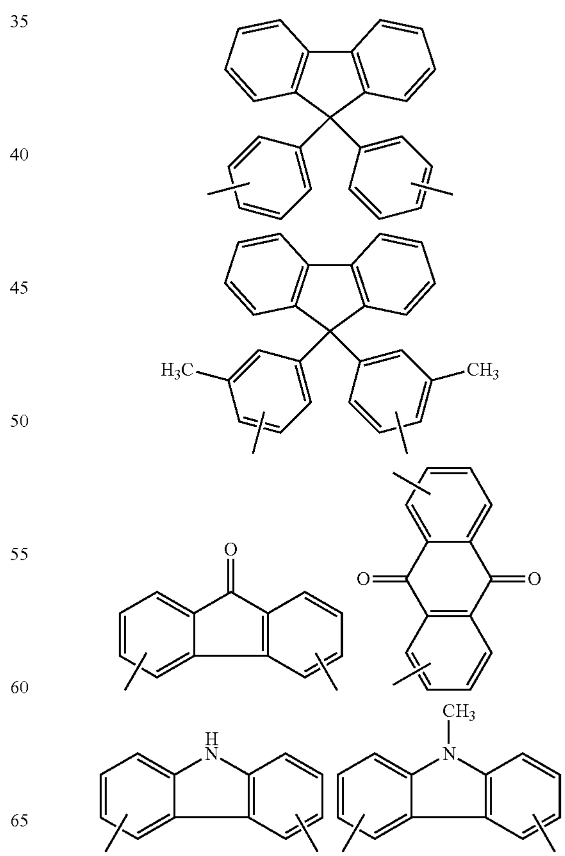

-continued

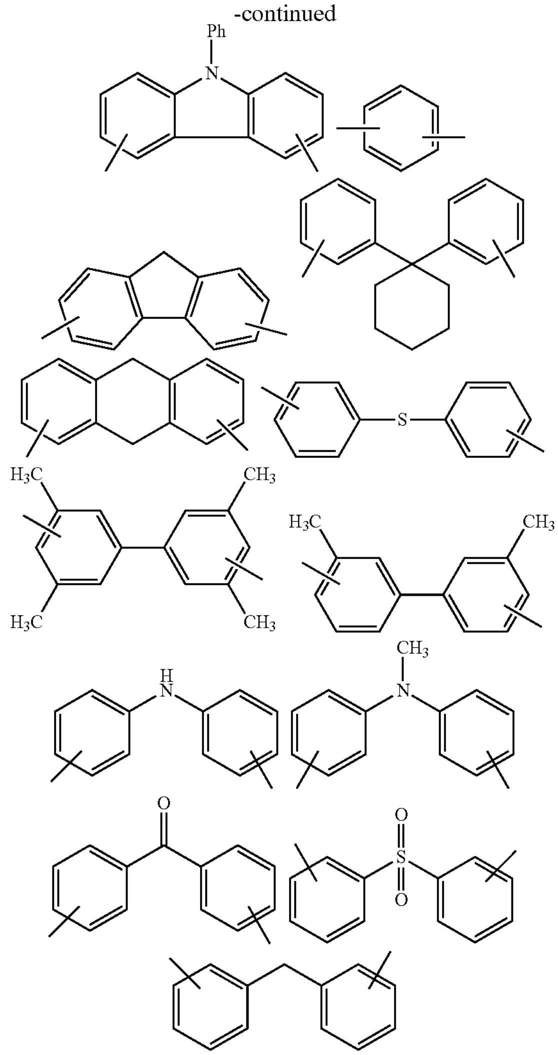

In particular, in consideration of further enhancing the solubility of the triazine ring-containing polymer in a highly safe solvent such as resist solvent, $Ar^1$ preferably represents m-phenylene group represented by formula (17).

(17)

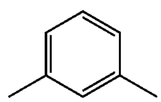

In the triazine ring-containing polymer used in the present invention, at least a part of the triazine ring terminal is blocked with a hydroxy group-substituted arylamino group, from the viewpoint of improving the solubility of a thin film or a cured film obtainable therefrom in an alkaline developer. The hydroxy group is directly bound to the aryl group, typically called phenolic hydroxy group.

The aryl group is exemplified by those same as the aforementioned ones, wherein phenyl group is particularly preferred.

The number of hydroxy groups on the aryl group, although not specifically limited, is preferably one, in consideration of balance between developability with alkaline developer, and solubility in organic solvent.

From these viewpoints, the hydroxy group-substituted arylamino group in the present invention is preferably a hydroxy group-substituted phenylamino group represented by formula (15), and more preferably a phenylamino group represented by formula (16), having a hydroxy group at the meta-position of the amino group.

(15)

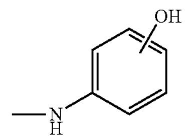

(16)

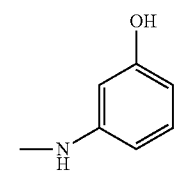

The weight average molecular weight of the triazine ring-containing polymer in the present invention, although not particularly limited, is preferably 500 to 500,000, and more preferably 500 to 100,000. From the viewpoint of further improving the heat resistance and of decreasing the shrinkage rate, the weight average molecular weight is more preferably 2,000 or higher, and from the viewpoint of further enhancing the solubility and of decreasing the viscosity of the obtainable solution, it is preferably 50,000 or lower, more preferably 30,000 or lower, even more preferably 15,000 or lower, and yet more preferably 10,000 or lower.

The weight average molecular weight in the present invention is an average molecular weight in terms of standard polystyrene, obtainable by gel permeation chromatography (referred to as GPC, hereinafter).

The triazine ring-containing polymer of the present invention (hyperbranched polymer) may be produced referring to the method disclosed in WO2010/128661.

For example, as illustrated by the following Scheme 1, a triazine ring-containing polymer (19) is obtainable by a reaction between a triazine compound (18) and an aryldiamino compound (20) in an appropriate organic solvent.

Scheme 1

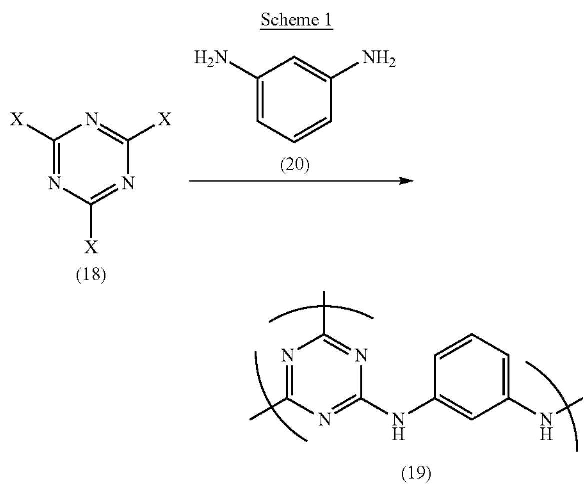

(20)

(18)

(19)

wherein each X independently represents a halogen atom.

In the aforementioned reaction, loading ratio of the aryldiamino compound (20) per one equivalent of the triazine compound (18), although freely selectable so long as an intended polymer is obtainable, is preferably 0.01 to 10 equivalents, and more preferably 0.7 to 5 equivalents.

The aryldiamino compound (20) may be added neat, or in the form of solution after dissolved in the organic solvent, wherein the latter technique is preferred in consideration of simplicity of operation and easiness of control of the reaction.

Reaction temperature may be suitably preset within the range from the melting point up to the boiling point of the solvent to be employed, which is preferably around −30 to 150° C., and more preferably around −10 to 100° C.

The organic solvent may be any of various solvents usually employed for this sort of reaction, and is exemplified by tetrahydrofuran (THF), dioxane, dimethyl sulfoxide; amide-based solvents such as N,N-dimethylformamide, N-methyl-2-pyrrolidone, tetramethylurea, hexamethylphosphoramide, N,N-dimethylacetamide, 3-methoxy-N, N-dimethylpropaneamide, 3-butoxy-N,N-dimethylpropaneamide, N-methyl-2-piperidone, N,N-dimethylethyleneurea, N,N,N',N'-tetramethylmalonic acid amide, N-methylcaprolactam, N-acetylpyrrolidine, N,N-diethylacetamide, N-ethyl-2-pyrrolidone, N,N-dimethylpropionic acid amide, N,N-dimethylisobutylamide, N-methylformamide, and N,N'-dimethylpropyleneurea; and mixed solvents of them.

Among them, preferred is N,N-dimethylformamide, dimethylsulfoxide, N-methyl-2-pyrrolidone, N,N-dimethylacetamide, 3-methoxy-N,N-dimethylpropanamide, 3-butoxy-N,N-dimethylpropanamide, or a mixed system thereof; and particularly preferred is N,N-dimethylacetamide, 3-methoxy-N,N-dimethylpropanamide, 3-butoxy-N,N-dimethylpropanamide, or N-methyl-2-pyrrolidone.

In the reaction in Scheme 1, any of various bases usually employed may be added during or after the polymerization.

The base is specifically exemplified by potassium carbonate, potassium hydroxide, sodium carbonate, sodium hydroxide, sodium bicarbonate, sodium ethoxide, sodium acetate, lithium carbonate, lithium hydroxide, lithium oxide, potassium acetate, magnesium oxide, calcium oxide, barium hydroxide, trilithium phosphate, trisodium phosphate, tripotassium phosphate, cesium fluoride, aluminum oxide, ammonia, n-propylamine, trimethylamine, triethylamine, diisopropylamine, diisopropylethylamine, N-methylpiperidine, 2,2,6,6-tetramethyl-N-methylpiperidine, pyridine, 4-dimethylaminopyridine, N-methylmorpholine, 2-aminoethanol, ethyldiethanolamine, and diethylaminoethanol.

The amount of addition of the base is preferably 1 to 100 equivalents per one equivalent of the triazine compound (18), and is more preferably 1 to 10 equivalents. These bases may be used in the form of aqueous solution.

Although the obtainable polymer is preferably free of residual raw material, the raw material may partially remain without undermining the effect of the present invention.

After completion of the reaction, the product may be easily purified typically by reprecipitation.

As described previously, the triazine ring-containing polymer of the present invention has at least one triazine ring terminal, and at least a part of the triazine ring terminal is blocked with the hydroxy group-substituted arylamino group.

Method for the terminal blocking may rely upon any of known methods. For example, the triazine ring-containing polymer (19) obtained by the aforementioned method may be treated with a terminal blocking agent that gives a terminal blocking group, which is exemplified by phenolic hydroxy group-containing arylamine compound such as aminophenol.

The amount of consumption of the terminal blocking agent is preferably about 0.05 to 10 equivalents, per one equivalent of halogen atom derived from excessive triazine compound remained unconsumed for the polymerization reaction, which is more preferably about 0.1 to 5 equivalents, and even more preferably 0.5 to 2 equivalents.

The reaction solvent and the reaction temperature may rely upon those having been described for Scheme 1. The terminal blocking agent may be charged together with the aryldiamino compound (20).

Note that the terminal may alternatively be blocked with two or more kinds of group, typically by using the aforementioned hydroxy group-substituted arylamine, together with a substituent-free arylamine compound.

In the present invention, particularly preferred triazine ring-containing polymer is exemplified by, but not limited to, those represented by formulae (21) to (24).

(21)

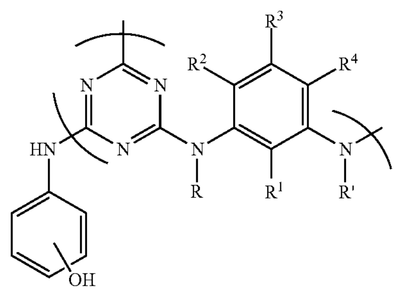

wherein R, R', and $R^1$ to $R^4$ are synonymous to those described previously.

(22)

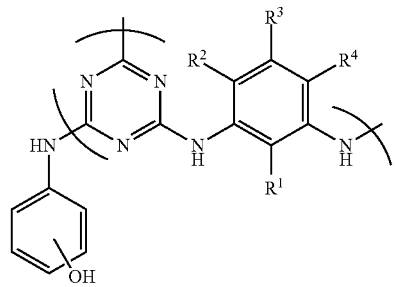

wherein $R^1$ to $R^4$ are synonymous to those described previously.

(23)

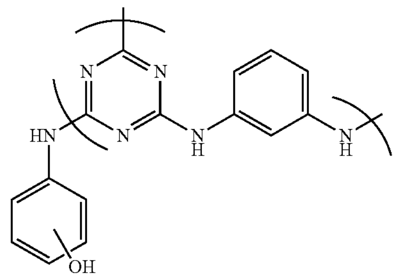

-continued (24)

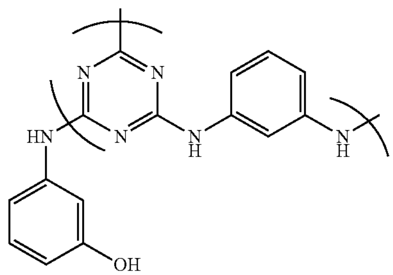

(2) Crosslinking Agent

The crosslinking agent used in the present invention is not particularly limited as long as it is a compound capable of forming a crosslinked structure by causing a crosslinking reaction alone by itself, or by causing a crosslinking reaction together with the aforementioned triazine ring-containing polymer.

This sort of compound is exemplified by melamine-based compound having crosslinkage-forming substituent such as methylol group or methoxymethyl group (for example, phenoplast compound, aminoplast compound, etc.); substituted urea-based compound; compound having crosslinkage-forming substituent such as epoxy group or oxetane group (for example, polyfunctional epoxy compound, polyfunctional oxetane compound, etc.); compound having blocked isocyanate group; compound having acid anhydride group; and compound having (meth)acrylic group. From the viewpoint of heat resistance and shelf stability, preferred are compound having epoxy group, blocked isocyanate group, or (meth)acrylic group; and particularly preferred are compound having blocked isocyanate group, and polyfunctional epoxy compound and/or polyfunctional (meth)acrylic compound capable of yielding photocurable composition without using initiator.

Note that these compounds, when intended for use in crosslinking treatment of polymers, or for use in formation of the crosslinked structure solely by itself, necessarily has at least two crosslinkage-forming substituents.

The polyfunctional epoxy compound is not specifically limited so long as it has two or more epoxy groups per molecule.

Specific examples thereof include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidylphenyl glycidyl ether, 1,1,3-tris[p-(2,3-epoxypropoxy)phenyl]propane, 1,2-cyclohexanedicarboxylic acid diglycidyl ester, 4,4'-methylenebis(N,N-diglycidylaniline), 3,4-epoxycyclohexylmethyl-3,4-epoxycyclohexanecarboxylate, trimethylolethane triglycidyl ether, bisphenol-A-diglycidyl ether, and pentaerythritol polyglycidyl ether.

Commercially available products employable here include epoxy resin having at least two epoxy groups such as YH-434 and YH-434L (from NIPPON STEEL Chemical & Materials Co., Ltd.); epoxy resin having a cyclohexene oxide structure such as EPOLEAD GT-401, GT-403, GT-301 and GT-302, CELLOXIDE 2021 and 3000 (from Daicel Corporation); bisphenol A type epoxy resin such as jER 1001, 1002, 1003, 1004, 1007, 1009, 1010 and 828 (all from Mitsubishi Chemical Corporation); bisphenol F type epoxy resin such as jER807 (from Mitsubishi Chemical Corporation); phenol novolac type epoxy resin such as jER 152 and 154 (both from Mitsubishi Chemical Corporation), EPPN201 and 202 (both from Nippon Kayaku Co., Ltd.); cresol novolac type epoxy resin such as EOCN-102, 103S, 104S, 1020, 1025 and 1027 (all from Nippon Kayaku Co., Ltd.), jER180S75 (from Mitsubishi Chemical Corporation); alicyclic epoxy resin such as Denacol EX-252 (from Nagase ChemteX Corporation), CY-175, CY177, and CY179 (all from CIBA-GEIGY A.G.), Araldite CY-182, CY-192, and CY-184 (all from CIBA-GEIGY A.G.), EPICLON 200 and 400 (both from DIC Corporation), jER 871 and 872 (both from Mitsubishi Chemical Corporation), ED-5661 and ED-5662 (both from Ceranise Coating Co., Ltd.); and aliphatic polyglycidyl ether such as Denacol EX-611, EX-612, EX-614, EX-622, EX-411, EX-512, EX-522, EX-421, EX-313, EX-314 and EX-321 (all from Nagase ChemteX Corporation).

The polyfunctional (meth)acryl compound is not specifically limited so long as it has two or more (meth)acryl groups per molecule.

Specific examples thereof include ethylene glycol diacrylate, ethylene glycol dimethacrylate, polyethylene glycol diacrylate, polyethylene glycol dimethacrylate, ethoxylated bisphenol A diacrylate, ethoxylated bisphenol A dimethacrylate, ethoxylated trimethylolpropane triacrylate, ethoxylated trimethylolpropane trimethacrylate, ethoxylated glycerin triacrylate, ethoxylated glycerin trimethacrylate, ethoxylated pentaerythritol tetraacrylate, ethoxylated pentaerythritol tetramethacrylate, ethoxylated dipentaerythritol hexaacrylate, polyglycerin monoethylene oxide polyacrylate, polyglycerin polyethylene glycol polyacrylate, dipentaerythritol hexaacrylate, dipentaerythritol hexamethacrylate, neopentyl glycol diacrylate, neopentyl glycol dimethacrylate, pentaerythritol triacrylate, pentaerythritol trimethacrylate, trimethylolpropane triacrylate, trimethylolpropane trimethacrylate, tricyclodecane dimethanol diacrylate, tricyclodecane dimethanol dimethacrylate, 1,6-hexanediol diacrylate, 1,6-hexanediol dimethacrylate, and polybasic acid-modified acrylic oligomer.

The polyfunctional (meth)acrylic compound is also commercially available, and is specifically exemplified by NK Ester A-200, ditto A-400, ditto A-600, ditto A-1000, ditto A-9300 (tris(2-acryloyloxyethyl) isocyanurate), ditto A-9300-1CL, ditto A-TMPT, ditto UA-53H, ditto 1G, ditto 2G, ditto 3G, ditto 4G, ditto 9G, ditto 14G, ditto 23G, ditto ABE-300, ditto A-BPE-4, ditto A-BPE-6, ditto A-BPE-10, ditto A-BPE-20, ditto A-BPE-30, ditto BPE-80N, ditto BPE-100N, ditto BPE-200, ditto BPE-500, ditto BPE-900, ditto BPE-1300N, ditto A-GLY-3E, ditto A-GLY-9E, ditto A-GLY-20E, ditto A-TMPT-3E0, ditto A-TMPT-9E0, ditto AT-20E, ditto ATM-4E, ditto ATM-35E, A-DPH, ditto A-TMPT, ditto A-DCP, ditto A-HD-N, ditto TMPT, ditto DCP, ditto NPG, ditto HD-N, ditto A-DPH-12E, ditto A-DPH-48E, ditto A-DPH-96E, NK Oligo U-15HA, and NK Polymer Vanaresin GH-1203 (all from Shin-Nakamura Chemical Co., Ltd.); KAYARAD (registered trademark) DPHA, ditto NPGDA, ditto PET30, ditto DPEA-12, ditto PEG400DA, ditto THE-330, ditto RP-1040, and DN-0075 (all from Nippon Kayaku Co., Ltd.); Aronix M-210, ditto M-303, ditto M-305, ditto M-306, ditto M-309, ditto M-306, ditto M-310, ditto M-313, ditto M-315, ditto M-321, ditto M-350, ditto M-360, ditto M-400, ditto M-402, ditto M-403, ditto M-404, ditto M-405, ditto M-406, ditto M-408, ditto M-450, ditto M-452, and ditto M-460 (all from Toagosei Co., Ltd.); and DPGDA, HDDA, TPGDA, HPNDA, PETIA, PETRA, TMPTA, TMPEOTA, EBECRYL 11, ditto 40, ditto 135, ditto 140, ditto 145, ibid. 150, ditto 180, ditto 1142, ditto 204, ditto 205, ditto 210, ditto 215, ditto 220, ditto 230, ditto 244, ditto 245, ditto 265, ditto 270, ditto 280/15IB, ditto 284, ditto 294/25HD, ditto 303, ditto 436, ditto 438, ditto 446, ditto 450, ditto 524, ditto 525, ditto 600, ditto 605, ditto 645, ditto 648, ditto 767, ditto 770, ditto 800, ditto 810, ditto 811, ditto 812, ditto 846, ditto 851, ditto 852, ditto 853, ditto 860, ditto 884, ditto 885, ditto 1259, ditto 1290, ditto 1606, ditto 1830, ditto 1870, ditto 3500, ditto 3603, ditto 3608, ditto 3700, ditto 3701, ditto 3702, ditto 3703, ditto 3708, ditto 4820, ditto 4858, ditto 5129, ditto 6040, ditto 8210, ditto 8454, ditto 8301R, ditto 8307, ditto 8311, ditto 8402, ditto 8405, ditto 8411, ditto 8465, ditto 8701, ditto 8800, ditto 8804, ditto 8807, ditto 9270, ditto 9227EA, ditto 936, KRM8200, ditto 8200AE, ditto 7735, ditto 8296, ditto 08452, ditto 8904, ditto 8528, ditto 8912, OTA480, IRR214-K, ditto 616, ditto 679, ditto 742, ditto 793, PEG400DA-D (ACA)Z200M, ditto Z230AA, ditto 2250, ditto 2251, ditto 2300, ditto Z320, ditto Z254F (all from Daicel-Allnex Ltd.).

Also the polybasic acid-modified acrylic oligomer is commercially available, and specific examples thereof include ARONIX M-510 and 520 (both from Toagosei Co., Ltd.).

The compound having acid anhydride group is not specifically limited so long as it is a carboxylic anhydride obtained by dehydration condensation of two carboxylic acid molecules, and specific examples thereof include compound having one acid anhydride group in the molecule, such as phthalic anhydride, tetrahydrophthalic anhydride, hexahydrophthalic anhydride, methyltetrahydrophthalic anhydride, methylhexahydrophthalic anhydride, nadic anhydride, methylnadic anhydride, maleic anhydride, succinic anhydride, octylsuccinic anhydride, and dodecenylsuccinic anhydride; and compound having two acid anhydride groups in the molecule, such as 1,2,3,4-cyclobutanetetracarboxylic dianhydride, pyromellitic anhydride, 3,4-dicarboxy-1,2,3,4-tetrahydro-1-naphthalenesuccinic dianhydride, bicyclo [3.3.0]octane-2,4,6,8-tetracarboxylic dianhydride, 5-(2,5-dioxotetrahydro-3-furanyl)-3-methyl-3-cyclohexene-1,2-dicarboxylic anhydride, 1,2,3,4-butanetetracarboxylic dianhydride, 3,3',4,4'-benzophenonetetracarboxylic dianhydride, 3,3',4,4'-biphenyltetracarboxylic dianhydride, 2,2-bis (3,4-dicarboxyphenyl) hexafluoropropane dianhydride, and 1,3-dimethyl-1,2,3,4-cyclobutanetetracarboxylic dianhydride.

The compound having blocked isocyanate group is not particularly limited so long as it has, per molecule, two or more blocked isocyanate groups having an appropriate protecting group for blocking the isocyanate group (—NCO), and so long as it releases the protecting group (block moiety) as a result of thermal dissociation when exposed to high temperatures during heat curing, allowing the generated isocyanate group to cause urethane bonding reaction with the phenolic hydroxy group of the triazine ring-containing polymer of the present invention. The compound is exemplified by those having, per molecule, two or more groups represented by the formula below (these groups may be same or different).

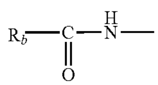

wherein $R_b$ represents an organic group in the block moiety.

This sort of compound is obtainable typically by reacting a compound having, per molecule, two or more isocyanate groups with an appropriate blocking agent.

The compound having, per molecule, two or more isocyanate groups is exemplified by polyisocyanate such as isophorone diisocyanate, 1,6-hexamethylene diisocyanate, methylenebis(4-cyclohexyl isocyanate), and trimethylhexamethylene diisocyanate; dimers and trimers thereof; and reaction products thereof with diols, triols, diamines, or triamines.

The blocking agent is exemplified by alcohols such as methanol, ethanol, isopropanol, n-butanol, 2-ethoxyhexanol, 2-N,N-dimethylaminoethanol, 2-ethoxyethanol, and cyclohexanol; phenols such as phenol, o-nitrophenol, p-chlorophenol, and o-, m- or p-cresol; lactams such as ε-caprolactam; oximes such as acetone oxime, methyl ethyl ketone oxime, methyl isobutyl ketone oxime, cyclohexanone oxime, acetophenone oxime, and benzophenone oxime; pyrazoles such as pyrazole, 3,5-dimethylpyrazole, and 3-methylpyrazole; and thiols such as dodecanethiol and benzenethiol.

The compound having blocked isocyanate group is also commercially available, and is specifically exemplified by Takenate (registered trademark) B-830, B-815N, B-842N, B-870N, B-874N, B-882N, B-7005, B-7030, B-7075, and B-5010 (all from Mitsui Chemicals, Inc.); Duranate (registered trademark) 17B-60PX, ditto TPA-B80E, ditto MF-B60X, ditto MF-K60X, and ditto E402-B8OT (all from Asahi Kasei Corporation); Karenz MOI-BM (registered trademark) (from Showa Denko K.K.); and TRIXENE (registered trademark) BI7950, ditto 7951, ditto 7960, ditto 7961, ditto 7982, ditto 7990, ditto 7991, and ditto 7992 (from Baxenden Chemicals Ltd.).

The aminoplast compound is not specifically limited so long as it has, per molecule, two or more methoxymethyl groups, and is exemplified by melamine-based compound such as those named CYMEL Series that include hexamethoxymethylmelamine CYMEL (registered trademark) 303, tetrabutoxymethylglycoluril CYMEL 1170, tetramethoxymethylbenzoguanamine CYMEL 1123 (all from Nippon Cytec Industries, Ltd.); those named NIKALAC Series that include methylated melamine resin such as NIKALAC (registered trademark) MW-30HM, MW-390, MW-100LM, and MX-750LM, and methylated urea resin such as NIKALAC MX-270, MX-280, and MX-290 (all from SANWA Chemical Co., Ltd.).

The polyfunctional oxetane compound is not specifically limited so long as it has, per molecule, two or more oxetanyl groups, and is exemplified by OXT-221, OX-SQ-H, and OX-SC (all from Toagosei Co., Ltd.) that contain oxetanyl group.

The phenoplast compound has two or more hydroxymethyl groups per molecule, and causes, when exposed to high temperatures during heat curing, a crosslinking reaction based on dehydration condensation with the phenolic hydroxy group of the triazine ring-containing polymer of the present invention to proceed.

The phenoplast compound is exemplified by 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, 2,2-bis(4-hydroxy-3,5-dihydroxymethylphenyl)propane, bis(3-formyl-4-hydroxyphenyl)methane, bis(4-hydroxy-2,5-dimethylphenyl)formylmethane, and α,α-bis(4-hydroxy-2,5-dimethylphenyl)-4-formyltoluene.

The phenoplast compound is also commercially available, and is specifically exemplified by 26DMPC, 46DMOC, DM-BIPC-F, DM-BIOC-F, TM-BIP-A, BISA-F, BI25X-DF, and BI25X-TPA (all from Asahi Yukizai Corporation).

Among them, polyfunctional (meth)acrylic compound is preferred from the viewpoint of capability of suppressing decrease in the refractive index due to blending of the crosslinking agent, and of allowing rapid progress of the curing reaction, and in particular, dipentaerythritol hexaacrylate and an EO adduct thereof are preferred from the viewpoint of shape controllability of a fine pattern.

The polyfunctional (meth)acrylic compound is exemplified by NK Ester A-DPH, and ditto A-DPH-12E (both from Shin-Nakamura Chemical Co., Ltd.).

The aforementioned crosslinking agents may be used independently, or by combining two or more kinds of them. The amount of consumption of the crosslinking agent is preferably 1 to 200 parts by mass, per 100 parts by mass of the triazine ring-containing polymer, wherein the lower limit is preferably 2 parts by mass, and more preferably 5 parts by mass in consideration of solvent resistance, meanwhile the upper limit is preferably 150 parts by mass, more preferably 100 parts by mass, and even more preferably 90 parts by mass in consideration of controllability of refractive index and residue in the non-exposed area.

(3) Initiator

The composition of the present invention may also be blended with an initiator suited to each crosslinking agent. Note in a case where the polyfunctional epoxy compound and/or the polyfunctional (meth)acrylic compound is used as the crosslinking agent, an initiator may be used, although the photo-curing can proceed to give a cured film even without the initiator, as described previously.

In a case where the polyfunctional epoxy compound is used as the crosslinking agent, a photoacid generator or a photobase generator may be used.

The photoacid generator may only be properly selectable from known ones for use, for which onium salt derivatives such as diazonium salt, sulfonium salt and iodonium salt may be typically used.

Specific examples thereof include aryl diazonium salt such as phenyldiazonium hexafluorophosphate, 4-methoxyphenyldiazonium hexafluoroantimonate, and 4-methylphenyldiazonium hexafluorophosphate; diaryliodonium salt such as diphenyliodonium hexafluoroantimonate, di(4-methylphenyl)iodonium hexafluorophosphate, and di(4-tert-butylphenyl)iodonium hexafluorophosphate; and triarylsulfonium salt such as triphenylsulfonium hexafluoroantimonate, tris(4-methoxyphenyl)sulfonium hexafluorophosphate, diphenyl-4-thiophenoxyphenylsulfonium hexafluoroantimonate, diphenyl-4-thiophenoxyphenylsulfonium hexafluorophosphate, 4,4'-bis(diphenylsulfonio)phenylsulfide bishexafluoroantimonate, 4,4'-bis(diphenylsulfonio)phenylsulfide bishexafluorophosphate, 4,4'-bis[di(β-hydroxyethoxy)phenylsulfonio]phenyl sulfide bishexafluoroantimonate, 4,4'-bis[di(β-hydroxyethoxy)phenylsulfonio]phenyl sulfide bishexafluorophosphate, 4-[4'-(benzoyl)phenylthio]phenyl-di(4-fluorophenyl)sulfonium hexafluoroantimonate and 4-[4'-(benzoyl)phenylthio]phenyl-di(4-fluorophenyl)sulfonium hexafluorophosphate.

These onium salts may be commercially available, and is specifically exemplified by Sun-Aid SI-60, SI-80, SI-100, SI-60L, SI-80L, SI-100L, SI-L145, SI-L150, SI-L160, SI-L110 and SI-L147 (all from Sanshin Chemical Industry Co., Ltd.); UVI-6950, UVI-6970, UVI-6974, UVI-6990, UVI-6992 (all from Union Carbide Corporation); CPI-100P, CPI-100A, CPI-200K and CPI-200S (all from San-Apro Ltd.); Adeka Optomer SP-150, SP-151, SP-170 and SP-171 (all from ADEKA Corporation); Irgacure 261 (from BASF SE); CI-2481, CI-2624, CI-2639 and CI-2064 (all from Nippon Soda Co., Ltd.); CD-1010, CD-1011 and CD-1012 (all from Sartomer); DS-100, DS-101, DAM-101, DAM-102, DAM-105, DAM-201, DSM-301, NAI-100, NAI-101, NAI-105, NAI-106, SI-100, SI-101, SI-105, SI-106, PI-105, NDI-105, BENZOIN TOSYLATE, MBZ-101, MBZ-301, PYR-100, PYR-200, DNB-101, NB-101, NB-201, BBI-101, BBI-102, BBI-103 and BBI-109, (all from Midori Kagaku Co., Ltd.); PCI-061T, PCI-062T, PCI-020T and PCI-022T (all from Nippon Kayaku Co., Ltd.); and IBPF and IBCF (from SANWA Chemical Co., Ltd.).

On the other hand, also the photobase generator may only be properly selectable from known ones for use, for which Co-amine complex-based, oxime carboxylate ester-based, carbamate ester-based, and quaternary ammonium salt-based photobase generators may be used.

Specific examples thereof include 2-nitrobenzylcyclohexyl carbamate, triphenylmethanol, o-carbamoylhydroxylamide, o-carbamoyloxime, [[(2,6-dinitrobenzyl)oxy]carbonyl]cyclohexylamine, bis[[(2-nitrobenzyl)oxy]carbonyl]hexane-1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexaamminecobalt(III) tris(triphenylmethylborate), 2-benzyl-2-dimethylamino-1-(4-morpholinophenyl)butanone, 2,6-dimethyl-3,5-diacetyl-4-(2'-nitrophenyl)-1,4-dihydropyridine, and 2,6-dimethyl-3,5-diacetyl-4-(2',4'-dinitrophenyl)-1,4-dihydropyridine.

Alternatively, the photobase generator may be commercially available, and is specifically exemplified by TPS-OH, NBC-101 and ANC-101 (all from Midori Kagaku Co., Ltd.).

The amount of consumption of the photoacid or photobase generator, when used, is preferably in the range from 0.1 to 15 parts by mass, per 100 parts by mass of the polyfunctional epoxy compound, and more preferably in the range from 1 to 10 parts by mass.

Optionally, 1 to 100 parts by mass of an epoxy resin curing agent may be blended per 100 parts by mass of the polyfunctional epoxy compound.

Meanwhile, in a case where the polyfunctional (meth)acrylic compound is used, a photoradical polymerization initiator may be used.

Also the photoradical polymerization initiator may only be properly selectable from known ones for use, and is exemplified by acetophenones, benzophenones, Michler's benzoyl benzoates, amyloxime esters, oxime esters, tetramethylthiuram monosulfide, and thioxanthones.

In particular, preferred is a photo-cleavable photoradical polymerization initiator. The photocleavable photoradical polymerization initiator has been described in "Saishin UV Koka Gijutu (in Japanese, Latest UV Curing Technology) (p.159, issued by: Kazuhiro Takausu, published by: Technical Information Institute Co., Ltd., 1991).

Commercially available photoradical polymerization initiator is exemplified by Irgacure (trade name) 127, 184, 369, 379, 379EG, 651, 500, 754, 819, 903, 907, 784, 2959, CGI1700, CGI1750, CGI1850, CG24-61, OXE01, OXE02, OXE03, OXE04, Darocur 1116, 1173 and MBF from BASF SE; Lucirin (trade name) TPO from BASF SE; Ebecryl P36 from UCB S.A.; and Esacure (trade name) KIP150, KIP65LT, KIP100F, KT37, KT55, KT046 and KIP75/B from Fratelli Lamberti S.p.A.

The amount of consumption of the photoradical polymerization initiator, when used, is preferably in the range from 0.1 to 200 parts by mass, per 100 parts by mass of the polyfunctional (meth)acrylate compound, and more preferably in the range from 1 to 150 parts by mass.

(4) Organic Solvent

The organicsolvent is specifically exemplified by toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl normal butyl ketone, cyclopentanone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-methoxy-2-propanol, tetrahydrofuran, 1,4-dioxane, N,N-dimethylformamide, N,N-dimethylacetamide (DMAc), N-methylpyrrolidone, 1,3-dimethyl-2-imidazolidinone, dimethylsulfoxide, and N-cyclohexyl-2-pyrrolidinone. All of them may be used independently, or by combining two or more kinds of them.

The solid concentration in the composition in this case is not specifically limited so long as it would not affect the shelf stability, and may only be determined suitably depending on desired thickness of the film. More specifically, the solid content is preferably 0.1 to 50% by mass from the viewpoint of solubility and shelf stability, and is more preferably 0.1 to 40% by mass.

(5) Other Additives

The composition of the present invention may contain a component other than the triazine ring-containing polymer, the crosslinking agent, and the solvent, as long as the effects of the present invention will not be undermined, wherein such component is exemplified by additives such as leveling agent, surfactant, silane coupling agent, polymerization inhibitor, antioxidant, rust inhibitor, mold releasing agent, plasticizer, antifoaming agent, thickener, dispersant, antistatic agent, anti-settling agent, pigment, dye, ultraviolet absorber, light stabilizer, and inorganic fine particle.

The surfactant is exemplified by polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl allyl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; nonionic surfactants such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine-containing surfactants under trade names of EFTOP EF301, EF303 and EF352 (from Mitsubishi Materials Electronic Chemicals Co., Ltd., formerly Gemco Inc.)), Megaface F171, F173, R-08, R-30, R-40, R-41, F-114, F-410, F-430, F-444, F-477, F-552, F-553, F-554, F-555, F-556, F-557, F-558, F-559, F-561, F-562, F-563, RS-75, RS-72-K, RS-76-E, RS-76NS, and RS-77 (from DIC Corporation), Fluorad FC430 and FC431 (from Sumitomo 3M Ltd.), AsahiGuard AG710, Surflon S-382, SC101, SC102, SC103, SC104, SC105 and SC106 (from AGC Inc.); and organosiloxane polymers KP341 (from Shin-Etsu Chemical Co., Ltd), BYK-302, BYK-307, BYK-322, BYK-323, BYK-330, BYK-333, BYK-370, BYK-375 and BYK-378 (from BYK Japan KK).

These surfactants may be used independently, or by combining two or more kinds of them. The amount of consumption of the surfactant is preferably 0.0001 to 5 parts by mass, per 100 parts by mass of the triazine ring-containing polymer, more preferably 0.001 to 1 part by mass, and even more preferably 0.01 to 0.5 parts by mass.

(6) Method for Producing Pattern and Cured Article

According to the method for producing a pattern with use of the composition of the present invention, a desired cured film can be formed by applying the composition to a base, optionally evaporating off the solvent under heating, followed by curing under heating or photo-irradiation, wherein the production of the cured film by photo-irradiation is conducted by emitting light through a mask having formed thereon a desired pattern, followed by development with a developer, to form a fine pattern. Use of the pattern-forming composition of the present invention may also yield a cured article. The cured article is typically a convex lens-shaped fine pattern (lens).

In another exemplary method of producing the pattern, the photo-irradiation through a desired patterned mask may be replaced with pattern-wise laser irradiation.

Method for applying the composition in this case is freely selectable, for which employable is any of methods including spin coating, dipping, flow coating, ink-jetting, jet dispensing, spraying, bar coating, gravure coating, slit coating, roll coating, transfer printing, brush coating, blade coating, and air knife coating.

The base is exemplified by those formed of silicon, glass with indium tin oxide (ITO) film formed thereon, glass with indium zinc oxide (IZO) film formed thereon, polyethylene terephthalate (PET), plastic, glass, quartz, and ceramic. Also flexible base having flexibility is employable.

Baking temperature is not specifically limited for the purpose of evaporating off the solvent, and is typically 70 to 400° C.

Baking time may only be enough for evaporating off the solvent, and is typically 1 to 600 seconds.

Method for the baking is typically, but not specifically limited to, evaporation with use of a hot plate or an oven, under an appropriate atmosphere such as the ambient air, inert gas such as nitrogen, or vacuum.

The temperature and time of the baking may only be suitably selected according to processes for obtaining desired electronic device, that is, the baking condition is selectable so that the obtainable electronic device will have physical properties well adapted to the required properties.

Also conditions for photo-irradiation are not specifically limited, for which any appropriate energy and time of irradiation are used, depending on the triazine ring-containing polymer and the crosslinking agent to be employed.

Development after the light exposure may be conducted by immersing the exposed resin typically in an organic solvent developer or an aqueous developer.

The organic solvent developer is specifically exemplified by PGME (propylene glycol monomethyl ether), PGMEA (propylene glycol monomethyl ether acetate), mixed solvent of PGME and PGMEA, NMP (N-methyl-2-pyrrolidone), γ-butyrolactone, and DMSO (dimethyl sulfoxide); meanwhile the aqueous developer is specifically exemplified by alkali aqueous solution of sodium carbonate, potassium carbonate, sodium hydroxide, potassium hydroxide, and tetramethylammonium hydroxide.

Upon baking after the development, the composition of the present invention will cause reflow of the pattern, to give a fine pattern having a desired shape of convex lens. The lens has a high refractive index, and excels in transparency. The composition of the present invention is therefore suitable as a composition for forming lens.

Also the baking temperature in this case is preferably, but not specifically limited to, 70 to 400° C., more preferably 80 to 200° C., and even more preferably 85 to 150° C.

Also the baking time is freely selectable, and is preferably 1 to 60 minutes in consideration of obtaining a desired lens shape as a result of reflowing, which is more preferably 5 to 35 minutes, and still more preferably 7 to 15 minutes.

The baking may employ a method same as that described previously.

The composition of the present invention may further have an oxirane ring-containing compound and a photo-curing catalyst blended thereto.

The oxirane ring-containing compound is exemplified by compound having one or more, preferably two or more, oxirane rings in one molecule, and is specifically exemplified by glycidyl ether-type epoxy resin, glycidyl ester-type epoxy resin, alicyclic epoxy resin, epoxy-modified polybutadiene resin, and oxetane compound. These compounds may be used independently, or by combining two or more kinds thereof.

The amount of blending of the oxirane ring-containing compound is preferably, but not specifically limited to, approximately 10 to 400 parts by mass per 100 parts by mass of the triazine ring-containing polymer.

The photo-curing catalyst is exemplified by photo-cation generator. The photo-cation generator is specifically exemplified by triarylsulfonium salts such as triphenylsulfonium hexafluorophosphate and triphenylsulfonium hexafluoroantimonate; triarylselenium salt; and diaryliodonium salts such as diphenyliodonium hexafluorophosphate and diphenyliodonium hexafluoroantimonate. These compounds may be used independently, or by combining two or more kinds thereof.

The amount of blending of the photo-curing catalyst is preferably, but not specifically limited to, approximately 0.1 to 100 parts by mass, per 100 parts by mass of the triazine ring-containing polymer.

The oxirane ring-containing compound and the photo-curing catalyst may be blended with each component constituting the composition of the present invention, in a freely selectable order. The blending at this time may employ any of the aforementioned organic solvents.

Also the composition containing these components may be applied according to the aforementioned technique, and then may be cured under photo-irradiation typically with UV light, at 1 to 4000 $mJ/cm^2$. The photo-irradiation may be conducted according to any of known various techniques, typically with use of high-pressure mercury lamp, metal halide lamp, xenon lamp, LED, or laser light.

The composition may optionally be heated before and/or after the exposure, at approximately 85 to 150° C.

The post-exposure development may be conducted by immersing the exposed resin in the aforementioned organic solvent developer or the aqueous developer.

The size of the lens of the present invention is not specifically limited as long as it is employable as a high refractive index pattern of an organic EL element, and is preferably 0.1 to 1,000 μm wide, more preferably 0.5 to 500 μm wide, and even more preferably 1 to 100 μm wide; and is preferably 0.1 to 100 μm high, more preferably 0.5 to 50 μm high, and even more preferably 1 to 25 μm high.

The thus obtained lens of the present invention successfully achieves high heat resistance, high refractive index and low volume shrinkage, and is therefore suitably applicable to the fields of electronic devices and optical materials, when manufacturing a part of liquid crystal display, organic electroluminescence (EL) display, touch panel, optical semiconductor (LED) element, solid-state image sensor, organic thin-film solar cell, dye-sensitized solar cell, organic thin-film transistor (TFT), lens, prism, camera, binoculars, microscope, semiconductor exposure apparatus, and so forth.

In particular, the lens of the present invention having a shape of convex lens, with high transparency and high refractive index, is suitable for applications needing a high refractive index pattern, typically for extraction of light from organic EL display, or for black matrix.

EXAMPLES

The present invention will be described more specifically referring to Examples below, to which the present invention is however not limited. The measurement apparatuses used in Examples are as follows.

[$^1$H-NMR]

Apparatus: Bruker NMR System AVANCE III HD 500 (500 MHz)

Measuring solvent: DMSO-d6

Reference material: tetramethylsilane (TMS) (δ 0.0 ppm)

[GPC]

Apparatus: HLC-8200 GPC, from Tosoh Corporation

Column: Tosoh TSKgel α-3000+Tosoh TSKgel α-4000

Column temperature: 40° C.

Solvent: dimethylformamide (DMF)

Detector: UV (271 nm)

Calibration curve: standard polystyrene

[Ellipsometer]

Apparatus: multi-incident angle spectroscopic ellipsometer VASE, from J.A. Woollam Japan Corporation

[Spectrophotometric Colorimeter]

Apparatus: CM-3700 A, from Konica Minolta, Inc.

[Turbidimeter]

Apparatus: HAZE METER NDH 5000, from Nippon Denshoku Industries Co., Ltd.

[Optical Microscope]

Apparatus: OLYMPUS BX 51, from Olympus Corporation

[Electron Microscope]

Apparatus: JSM-7400F, from JEOL Ltd.

[Exposure]

Apparatus: Mask aligner MA6, from SUSS MicroTec SE

[Development]

Apparatus: compact developing apparatus ADE-3000S, from ActesKyosan Inc.

[1] Synthesis of Triazine Ring-Containing Polymer

Example 1 Synthesis of Polymer Compound [4]

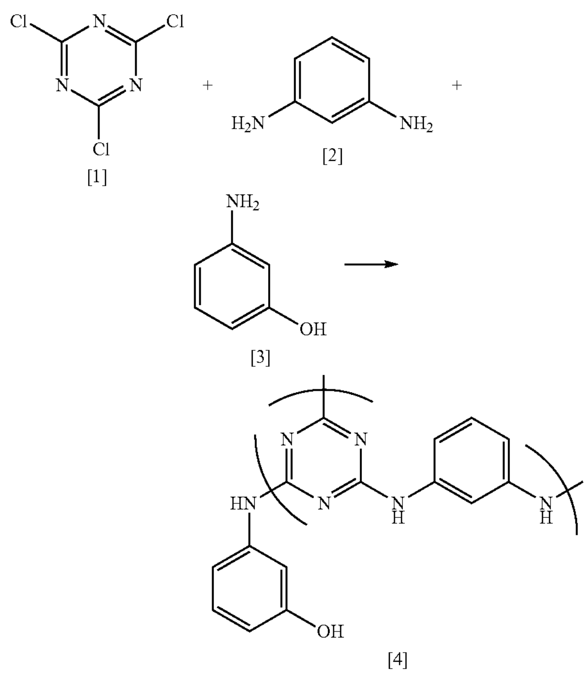

[1] [2] [3] [4]

Into a 5,000 mL four-necked flask, placed were 1,3-phenylenediamine [2] (228.70 g, 2.115 mol, from Amino-Chem Co., Ltd.), and 3464.72 g of dimethylacetamide (DMAc, from Kanto Chemical Co., Inc.), the inside of the flask was replaced with nitrogen, and the content was stirred to dissolve 1,3-phenylenediamine [2] in DMAc. The content was then cooled on an ethanol-dry ice bath down to −10° C., to which 2,4,6-trichloro-1,3,5-triazine [1] (390.00 g, 2.115 mol, from Tokyo Chemical Industry Co., Ltd.) was added while monitoring so that the internal temperature would not reach or exceed 0° C. After 30-minute stirring, the reaction liquid in a reaction vessel was transferred onto an oil bath preset at 110 to 150° C., and heated up to an inner temperature of 85° C.±5° C. After one-hour stirring, 3-aminophenol [3] (276.95 g, 2.538 mol, from Tokyo Chemical Industry Co., Ltd.), preliminarily dissolved in 649.64 g of DMAc (from Kanto Chemical Co., Inc.), was added dropwise, and the content was stirred for 3 hours. Thereafter, 2-aminoethanol (387.53 g, from Tokyo Chemical Industry Co., Ltd.) was added dropwise, the content was stirred for 30 minutes, and the stirring was stopped. Tetrahydrofuran (THF, 2,246 g), ammonium acetate (2,526 g) and ion-exchanged water (2,526 g) were added to the reaction liquid, and the content was stirred for 30 minutes. After stopping the stirring, the liquid was transferred to a separating funnel, separated into an organic layer and an aqueous layer, and the organic layer was collected. The collected organic layer was added dropwise to a mixed solution of methanol (8,421 g) and ion-exchanged water (5,614 g), to cause reprecipitation. The resulted precipitate was collected by filtration, and dried in a vacuum dryer at 120° C. for 8 hours, to obtain 536.2 g of a desired polymer compound [4] (referred to as P-1, hereinafter).

The weight average molecular weight Mw of the compound P-1 in terms of polystyrene equivalent, measured by GPC, was 5,970, and the polydispersity Mw/Mn was 2.5. The measurement result of $^1$H-NMR spectrum of the compound P-1 is illustrated in FIG. 1.

(1) Verification of Solubility

The obtained compound P-1 (3.0 g) was dissolved in each of propylene glycol monomethyl ether (abbreviated as PGME, hereinafter) (7.0 g), and cyclopentanone (abbreviated as CPN, hereinafter) (7.0 g), and was found to demonstrate good solubility in both solvents, and to give 30% by mass homogeneous varnishes.

(2) Verification of Refractive Index

The obtained compound P-1 (0.749 g), 0.007 g of 10% by mass Megaface R-40 (from DIC Corporation) solution in PGME as a surfactant, and 4.243 g of CPN were added to prepare 15 mass % film-forming composition (varnish) which was uniform and transparent (referred to as P-1 solution, hereinafter).

The obtained P-1 solution was spin-coated over a 50 mm×50 mm×0.7 mm thick alkali-free glass substrate with use of a spin coater to a target thickness of 1000 nm, pre-baked at 100° C. for one minute on a hot plate, followed by main baking at 250° C. for 5 minutes, to obtain a cured film (referred to as P-1 film, hereinafter) (929 nm thick). The refractive index of the prepared cured film, measured at a wavelength of 550 nm, was 1.778.

Example 2 Synthesis of Polymer Compound [5]

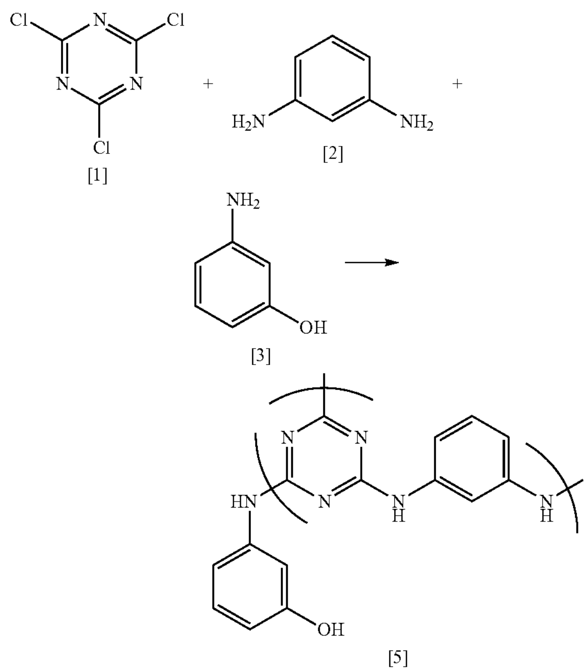

[1] [2] [3] [5]

Into a 1,000 mL four-necked flask, placed were 1,3-phenylenediamine [2] (45.15 g, 0.418 mol, from Amino-Chem Co., Ltd.), and 685.16 g of dimethylacetamide (DMAc, from Kanto Chemical Co., Inc.), the inside of the flask was replaced with nitrogen, and the content was stirred to dissolve 1,3-phenylenediamine [2] in DMAc. The content was then cooled on an ethanol-dry ice bath down to −10° C., to which 2,4,6-trichloro-1,3,5-triazine [1] (70.00 g, 0.380 mol, from Tokyo Chemical Industry Co., Ltd.) was added while monitoring so that the internal temperature would not reach or exceed 0° C. After 30-minute stirring, the reaction liquid in a reaction vessel was transferred onto an oil bath preset at 90 to 110° C., and heated up to an inner temperature of 85° C.±5° C. After one-hour stirring, 3-aminophenol [3] (49.71 g, 0.456 mol, from Tokyo Chemical Industry Co., Ltd.), preliminarily dissolved in 120.91 g of DMAc (from Kanto Chemical Co., Inc.), was added dropwise, and the content was stirred for 3 hours. Thereafter, 2-aminoethanol (69.56 g, from Tokyo Chemical Industry Co., Ltd.) was added dropwise, the content was stirred for 30 minutes, and the stirring was stopped. Tetrahydrofuran (THF, 416 g), ammonium acetate (468.2 g), and ion-exchanged water (468.2 g) were added to the reaction liquid, and the content was stirred for 30 minutes. After stopping the stirring, the liquid was transferred to a separating funnel, separated into an organic layer and an aqueous layer, and the organic layer was collected. The collected organic layer was added dropwise to a mixed solution of methanol (1,040 g) and ion-exchanged water (1,561 g), to cause reprecipitation. The resulted precipitate was collected by filtration, and dried in a vacuum dryer at 120° C. for 8 hours, to obtain 95.1 g of a desired polymer compound [5] (referred to as P-2, hereinafter).

Figure 2:
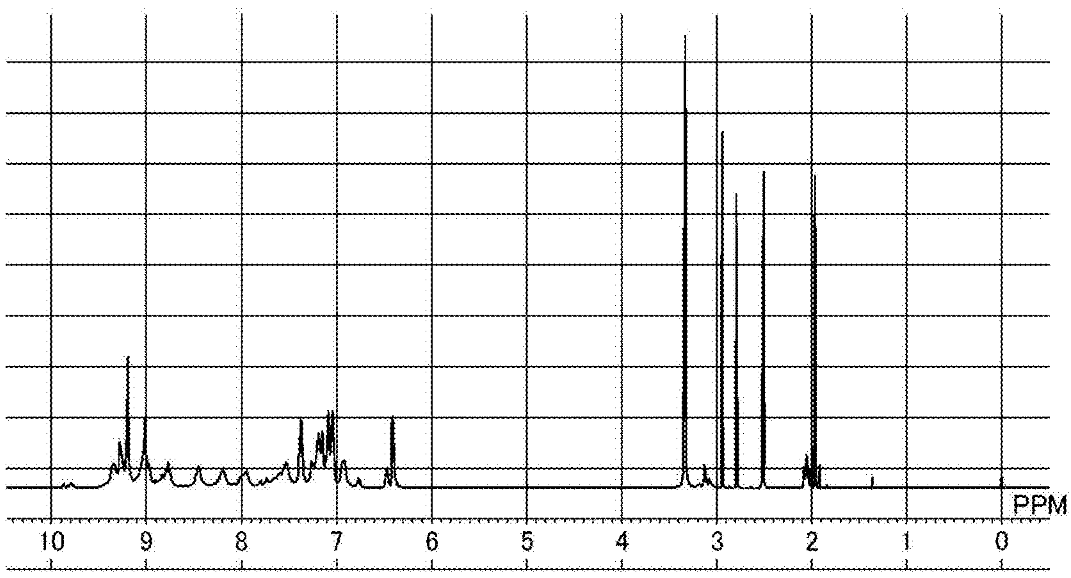
FIG. 2 is a $^1$H-NMR spectral chart of a polymer compound [5] obtained in Example 2.

The weight average molecular weight Mw of the compound P-2 in terms of polystyrene equivalent, measured by GPC, was 12,384, and the polydispersity Mw/Mn was 3.3. The measurement result of $^1$H-NMR spectrum of the compound P-2 is illustrated in FIG. 2.

[2] Preparation of Lens-Forming Composition, and Production of Lens

Example 3

The compound P-1 (11.731 g) obtained in Example 1, 13.197 g of 80% by mass solution in CPN of crosslinking agent A-DPH-12E (from Shin-Nakamura Chemical Co., Ltd.), 3.519 g of 10% by mass solution in CPN of photoradical polymerization initiator OXE-04 (from BASF SE), 0.235 g of 10% by mass solution in CPN of surfactant Megaface R-40 (from DIC Corporation), and 30.65 g of CPN were blended, whose solubilization was visually confirmed, whereby a varnish having a solid content of 38.2% by mass (referred to as SP-1 solution, hereinafter) was prepared.

(1) Verification of Physical Properties of Cured Film

The SP-1 solution was spin-coated over a 50 mm×50 mm×0.7 mm thick alkali-free glass substrate with use of a spin coater at 200 rpm for 5 seconds, then at 590 rpm for 30 seconds, and pre-dried at 100° C. for one minute on a hot plate, to obtain a cured film (referred to as SP-1 film, hereinafter).

The thus obtained cured film was measured for refractive index, thickness, b*, transmittance over a range from 400 to 800 nm, and HAZE. Results are summarized in Table 1. The transmittance calculated here was average transmittance over a range from 400 to 800 nm.

TABLE 1

| | |
|---|---|
| Refractive index (at 550 nm) | 1.647 |
| Thickness (nm) | 8170 |
| b* | 1.2 |
| Transmittance (%) | 97.4 |
| HAZE | 0.04 |

The results teach that the cured film obtained from the SP-1 solution can keep high refractive index, and can keep high transmittance despite large thickness, proving excellent effects.

(2) Production of Lens

The SP-1 solution prepared in Example 3 was spin-coated on a 50 mm×50 mm×0.7 mm thick alkali-free glass substrate with a spin coater at 200 rpm for 5 seconds, then at 590 rpm for 30 seconds, and pre-dried at 100° C. for 1 minute on a hot plate. A mask having 15 μm diameter circular openings arranged at 15 μm intervals, and the residual space other than the openings (UV shield area) was placed on the coated film, and the coated film was irradiated with 365 nm light at an exposure dose of 150 mJ/cm$^2$, with use of mask aligner MA6 from SUSS MicroTec SE.

After UV irradiation, the film was developed for 40 seconds with a 2.38% tetramethylammonium hydroxide (abbreviated as TMAH, hereinafter) solution, and then rinsed with ultrapure water for 30 seconds. After the rinsing, the product was dried on a hot plate at 100° C. for 10 minutes, to obtain a patterned film.

Figure 3:
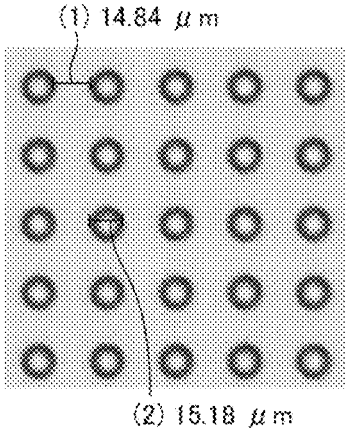
FIG. 3 is an optical microphotograph of a patterned film produced in Example 3.
Figure 4:
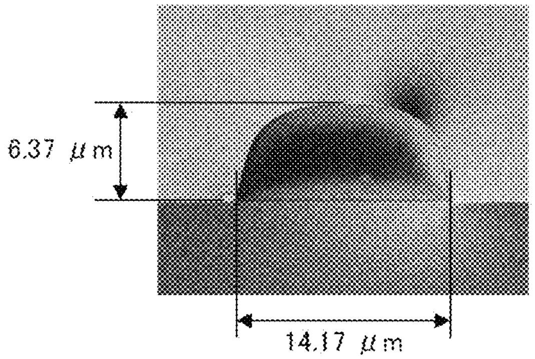
FIG. 4 is an electron microphotograph of the patterned film produced in Example 3.

An optical micrograph and an electron micrograph of the obtained patterned film are presented in FIGS. 3 and 4.

Example 4

The SP-1 solution prepared in Example 3 was spin-coated on a 50 mm×50 mm×0.7 mm thick alkali-free glass substrate with a spin coater at 200 rpm for 5 seconds, then at 590 rpm for 30 seconds, and pre-dried at 100° C. for 1 minute on a hot plate. A mask having 15 μm diameter circular openings arranged at 15 μm intervals, and the residual space other than the openings (UV shield area) was placed on the coated film, and the coated film was irradiated with 365 nm light at an exposure dose of 150 mJ/cm$^2$, with use of mask aligner MA6 from SUSS MicroTec SE.

After the UV irradiation, the film was developed for 40 seconds with a 2.38% TMAH solution, and then rinsed with ultrapure water for 30 seconds.

Figure 5:
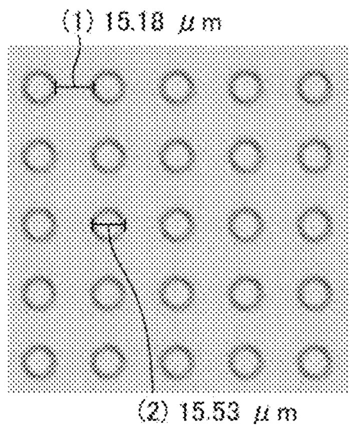
FIG. 5 is an optical microphotograph of a patterned film produced in Example 4.
Figure 6:
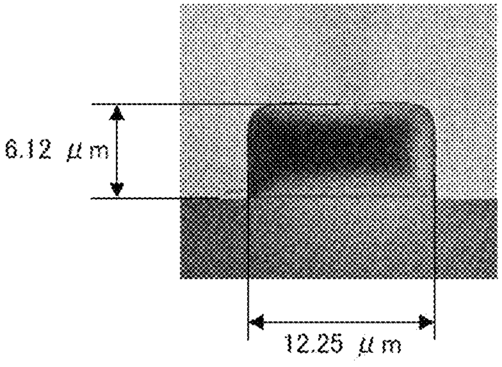
FIG. 6 is an electron microphotograph of the patterned film produced in Example 4.

An optical micrograph and an electron micrograph of the obtained patterned film are presented in FIGS. 5 and 6.

FIG. 4 presents that the patterned film went through the post-development baking was found to have a shape of convex lens, in contrast FIG. 6 presents that the patterned film without going through the post-development baking was not found to have a shape of convex lens, although being neither reversely tapered nor causing an undercut, which is often observed in usual negative pattern.

The negative material, designed to cure in a portion irradiated from the top, often tends to produce a reversely tapered pattern, and is difficult to produce a shape of lens, which is an inversion from the reversely tapered pattern. The patterned film in Example 3 was, however, found to successfully produce a desired shape of convex lens despite of its negative nature, since the pattern caused reflow during the post-development baking. Hence, the present invention may be understood to demonstrate an unexpected effect, on the basis of quite unusual combination of the negative type composition and the reflow technique.

Example 5

The SP-1 solution prepared in Example 3 was spin-coated on a 50 mm×50 mm×0.7 mm thick alkali-free glass substrate with a spin coater at 200 rpm for 5 seconds, then at 930 rpm for 30 seconds, and pre-dried at 100° C. for 1 minute on a hot plate. A so-called, line-and-space mask, having 15 μm wide linear openings and 15 μm wide spaces (UV shield area) alternately arranged was placed on the coated film, and the coated film was irradiated with 365 nm light at an exposure dose of 150 mJ/cm$^2$, with use of mask aligner MA6 from SUSS MicroTec SE.

After UV irradiation, the film was developed for 60 seconds with a 2.38% TMAH solution, and then rinsed with ultrapure water for 30 seconds.

Figure 7:
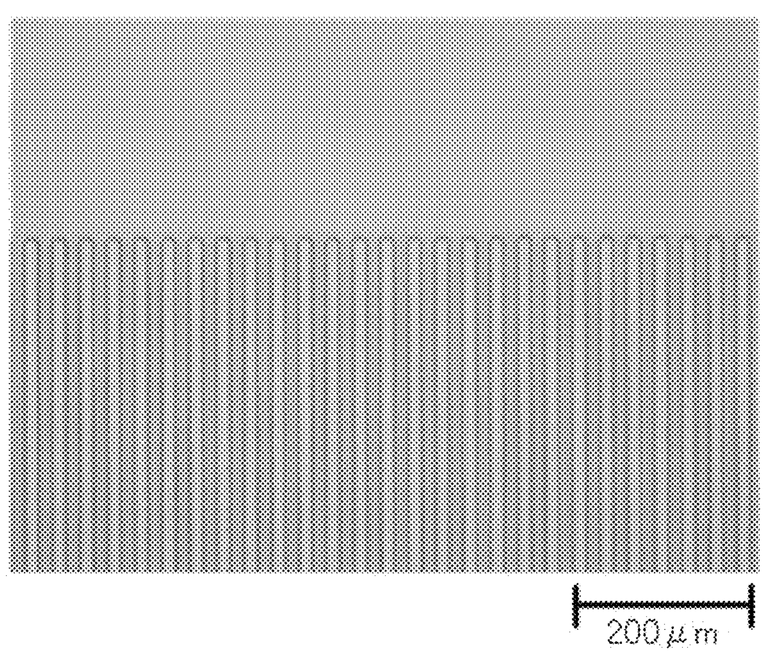
FIG. 7 is an optical microphotograph of a patterned film produced in Example 5.

An optical micrograph of the obtained patterned film is presented in FIG. 7.

FIG. 7 teaches that the present invention can form not only a dot pattern, but also a linear pattern.

The invention claimed is:

1. A method for producing a pattern, the method comprising:

applying a pattern-forming composition to a base to form a film coated on the base;

evaporating off organic solvent from said film coated on said base;

irradiating the film with light through a mask having a pattern formed thereon;

developing the film to obtain a pattern; and further baking the pattern after the developing to obtain the pattern having a shape of convex lens, wherein the pattern-forming composition contains a triazine ring-containing polymer that contains a repeating unit structure represented by formula (1) below and at least one triazine ring terminal, at least a part of the triazine ring terminal being blocked with a hydroxy group-substituted arylamino group; a crosslinking agent; and the organic solvent, wherein the triazine ring-containing polymer is a hyperbranched polymer, (1)

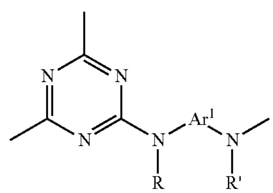

wherein each of R and R' independently represents a hydrogen atom, an alkyl group, an alkoxy group, an aryl group, or an aralkyl group, and $Ar^1$ represents at least one structure selected from the group consisting of structures represented by formulae (2) to (13), (2)

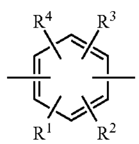

-continued (3)

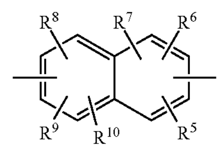

(4)

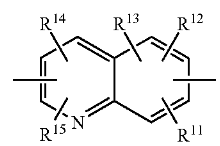

(5)

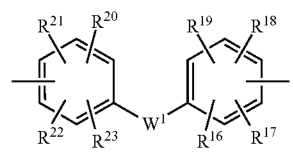

(6)

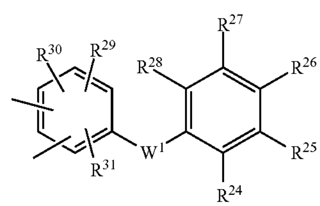

(7)

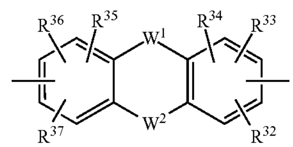

(8)

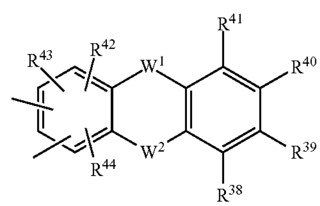

(9)

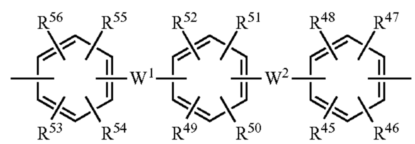

(10)

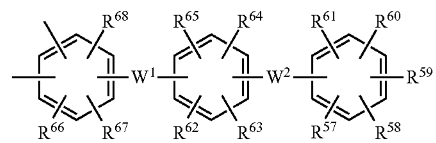

(11)

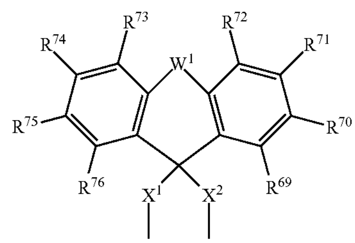

-continued (12)

(13)

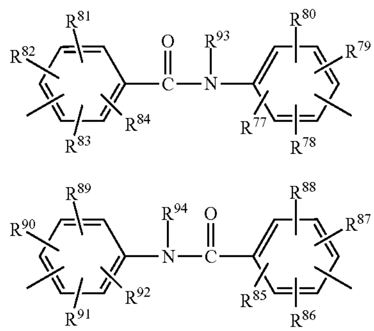

wherein each of $R^1$ to $R^{92}$ independently represents a hydrogen atom, a halogen atom, a sulfo group, an alkyl group having 1 to 10 carbon atoms, or an alkoxy group having 1 to 10 carbon atoms, each of $R^{93}$ and $R^{94}$ represents a hydrogen atom or an alkyl group having 1 to 10 carbon atoms, each of $W^1$ and $W^2$ independently represents a single bond, $CR^{95}R^{96}$, wherein each of $R^{95}$ and $R^{96}$ independently represents a hydrogen atom or an alkyl group having 1 to 10 carbon atoms or where $R^{95}$ and $R^{96}$ form a ring together with the carbon atom to which they are attached, C═O, O, S, SO, $SO_2$, or $NR^{97}$, wherein $R^{97}$ represents a hydrogen atom, an alkyl group having 1 to 10 carbon atoms, or a phenyl group, each of $X^1$ and $X^2$ independently represents a single bond, an alkylene group having 1 to 10 carbon atoms, or a group represented by formula (14)

(14)

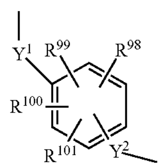

wherein each of $R^{98}$ to $R^{101}$ independently represents a hydrogen atom, a halogen atom, a sulfo group, an alkyl group having 1 to 10 carbon atoms, or an alkoxy group having 1 to 10 carbon atoms, each of $Y^1$ and $Y^2$ independently represents a single bond or an alkylene group having 1 to 10 carbon atoms;

wherein the hydroxy group-substituted arylamino group is represented by formula (15) below:

(15)

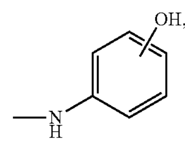

and wherein a weight average molecular weight of the triazine ring-containing polymer is 2,000 to 10,000, the crosslinking agent is a polyfunctional (meth)acrylic compound in an amount of 5 to 90 parts by mass, per 100 parts by mass of the triazine ring-containing polymer, the organic solvent comprises N,N-dimethylformamide, dimethylsulfoxide, N-methyl-2-pyrrolidone, N,N-dimethylacetamide, 3-methoxy-N,N-dimethylpropanamide, 3-butoxy-N,N-dimethylpropanamide, or a mixed system thereof; the pattern-forming composition has a solid concentration of 0.1 to 40% by mass, and the further baking of the pattern is performed at 85 to 150° C. for 7 to 15 minutes after the developing to obtain the pattern having a shape of convex lens.

2. The method for producing a pattern according to claim 1, wherein the hydroxy group-substituted arylamino group is represented by formula (16) below:

(16)

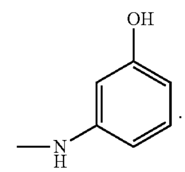

3. The method for producing a pattern according to claim 1, wherein $Ar^1$ is represented by formula (17) below:

(17)

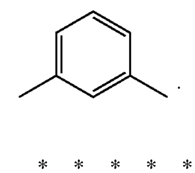

* * * * *